United States Patent
Matsuki et al.

(10) Patent No.: US 8,425,088 B2
(45) Date of Patent: *Apr. 23, 2013

(54) ILLUMINATING LENS, AND LIGHTING DEVICE

(75) Inventors: Daizaburo Matsuki, Osaka (JP); Syunsuke Kimura, Hyogo (JP); Tomoko Iiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/341,521

(22) Filed: Dec. 30, 2011

(65) Prior Publication Data
US 2012/0099327 A1 Apr. 26, 2012

Related U.S. Application Data

(63) Continuation of application No. 12/752,722, filed on Apr. 1, 2010, now Pat. No. 8,109,658, which is a continuation of application No. PCT/JP2009/003556, filed on Jul. 28, 2009.

(30) Foreign Application Priority Data

Aug. 7, 2008 (JP) ................. 2008-204336

(51) Int. Cl.
*F21V 3/00* (2006.01)
*F21V 5/00* (2006.01)
(52) U.S. Cl.
USPC ............ 362/311.02; 362/97.3; 362/244; 362/249.02; 362/311.06; 362/332; 362/335; 362/800

(58) Field of Classification Search .......... 362/97.3, 362/244, 246, 249.02, 311.02, 311.06, 332, 362/334–335, 612, 800
See application file for complete search history.

(56) References Cited

U.S. PATENT DOCUMENTS

| | | | |
|---|---|---|---|
| 7,348,723 B2 | 3/2008 | Yamaguchi et al. |
| 7,446,733 B1 | 11/2008 | Hirimai |
| 7,568,820 B2 | 8/2009 | Kodama et al. |
| 2006/0066218 A1 | 3/2006 | Yamaguchi et al. |
| 2007/0024990 A1 | 2/2007 | Paek et al. |
| 2007/0115660 A1 | 5/2007 | Lee et al. |
| 2008/0210962 A1 | 9/2008 | Blumel et al. |

FOREIGN PATENT DOCUMENTS

| | | |
|---|---|---|
| JP | 2000-292872 | 10/2000 |
| JP | 3375944 | 11/2002 |
| JP | 2004-170460 | 6/2004 |
| JP | 2006-215131 | 8/2006 |
| JP | 3875247 | 11/2006 |
| JP | 2007-034307 | 2/2007 |
| JP | 2007-133367 | 5/2007 |
| WO | 2006/089523 | 8/2006 |

*Primary Examiner* — Jason Moon Han
(74) *Attorney, Agent, or Firm* — Hamre, Schumann, Mueller & Larson, P.C.

(57) ABSTRACT

An illuminating lens includes: a light entrance surface through which light emitted from a light source enters the lens; and a light exit surface through which the light that has entered the lens exits the lens. The light exit surface has: a concave portion intersecting the optical axis; and a convex portion provided around the concave portion to extend continuously from the concave portion. The light exit surface is formed in a shape such that a curvature C of micro-segments of the light exit surface in a cross section including the optical axis has a maximum value at a position outward from the midpoint of the convex portion.

12 Claims, 21 Drawing Sheets

ILLUMINATING LENS, AND LIGHTING DEVICE

CROSS-REFERENCE TO RELATED APPLICATIONS

This application is a Continuation of application Ser. No. 12/752,722, filed Apr. 1, 2010, which is a Continuation of PCT/JP2009/003556, filed Jul. 28, 2009, which applications are incorporated herein by reference.

BACKGROUND OF THE INVENTION

1. Field of the Invention

The present invention relates to an illuminating lens for widening a range of transmission directions for light from a light source such as a light emitting diode, and to a lighting device using this illuminating lens. The present invention further relates to a surface light source including a plurality of lighting devices, and to a liquid-crystal display apparatus in which this surface light source is disposed behind a liquid-crystal panel to serve as a backlight.

2. Description of Related Art

In a conventional backlight of a large-sized liquid-crystal display apparatus, a number of cold cathode tubes are disposed immediately below a liquid-crystal panel, and these cold cathode tubes are used with other members such as a diffusing plate and a reflecting plate. In recent years, light emitting diodes have been used as light sources for backlights. Light emitting diodes have increased their efficiency recently, and are expected to serve as low-power light sources to replace fluorescent lamps. In the case where light emitting diodes are used as a light source in a liquid-crystal display apparatus, the power consumption of the apparatus can be reduced by controlling the light and dark states of the light emitting diodes according to an image to be displayed.

In a backlight of a liquid-crystal display apparatus using light emitting diodes as a light source, a large number of light emitting diodes are disposed therein instead of cold cathode tubes. The use of a large number of light emitting diodes allows the entire surface of the backlight to have uniform brightness, but the need for such a large number of light emitting diodes is an obstacle to cost reduction. In view of this, attempts to increase the output power of each light emitting diode to reduce the required number of light emitting diodes have been made. For example, Japanese Patent No. 3875247 has proposed a lens that is designed to provide a uniform surface light source with a reduced number of light emitting diodes.

In order to obtain a uniform surface light source with a reduced number of light emitting diodes, the area to be irradiated with the light emitted from each light emitting diode needs to be increased. That is, light emitted from each light emitting diode needs to be spread to obtain a wider range of transmission directions for light from the diode. For this purpose, in Japanese Patent No. 3875247, a lens having a circular shape in a plan view is disposed on a light emitting diode as a chip to control the directivity of the chip. The light exit surface of this lens, through which light exits the lens, has a shape such that a portion in the vicinity of the optical axis is a concave and a portion surrounding the concave is a convex extending continuously from the concave.

A light emitting diode as a chip emits light mostly in the front direction of the light emitting diode chip. In the lens disclosed in Japanese Patent No. 3875247, light that has been emitted in the front direction of the chip is diffused on the concave surface in the vicinity of the optical axis.

In the lens disclosed in Japanese Patent No. 3875247, the curvature radius of the light exit surface in a cross section including the optical axis has the smallest value at a position on the convex adjacent to the concave, and the portion outward from the vertex of the convex is an approximately conical surface. With the light exit surface having such a shape, however, there is a limit to a widening of the range of transmission directions for light from the light source.

SUMMARY OF THE INVENTION

It is an object of the present invention to provide an illuminating lens capable of further widening the range of transmission directions for light from a light source, and to provide a lighting device, a surface light source, and a liquid-crystal display apparatus each including this illuminating lens.

In order to achieve the above object, an illuminating lens according to the present invention is an illuminating lens for spreading light emitted from a light source so that a surface to be irradiated is irradiated with the spread light, and is characterized as follows. The illuminating lens includes: a light entrance surface through which the light emitted from the light source enters the lens; and a light exit surface through which the light that has entered the lens exits the lens, the light exit surface being rotationally symmetric with respect to an optical axis. In this illuminating lens, the light exit surface has a concave portion and a convex portion. The concave portion intersects the optical axis, and the convex portion is provided around the concave portion to extend continuously from the concave portion. The light exit surface is formed in a shape such that a curvature $C$ of micro-segments of the light exit surface in a cross section including the optical axis has a maximum value at a position outward from a midpoint of the convex portion.

The sign of the curvature $C$ is positive if the center of the curvature is located on the light source side of the light exit surface, and negative if the center of the curvature is located on the side opposite to the light source.

In such a configuration, light emitted from the light source can reach a larger area on the surface to be irradiated, and thus the resulting illuminating lens can widen the range of transmission directions for light from the light source further than before.

A lighting device according to the present invention is characterized in that it includes: a light emitting diode for emitting light; and the above-mentioned illuminating lens for spreading light emitted from the light emitting diode so that a surface to be irradiated is irradiated with the spread light.

With such a configuration, the lighting device having a wide range of transmission directions of light can be obtained.

A surface light source according to the present invention is characterized in that it includes: a plurality of lighting devices arranged in a plane; and a diffusing plate disposed to cover the plurality of lighting devices, and configured to receive on one surface thereof light emitted from the plurality of lighting devices and to emit the light from the other surface thereof in a diffused manner. Each of the plurality of lighting devices is the above-mentioned lighting device.

With such a configuration, the surface light source having less uneven brightness in the plane can be obtained.

A liquid-crystal display apparatus according to the present invention is characterized in that it includes: the above-mentioned surface light source; and a liquid-crystal panel that is to be irradiated with light emitted from the surface light source disposed behind the liquid-crystal panel.

With such a configuration, the liquid-crystal display apparatus having less uneven brightness can be obtained.

According to the present invention, the range of transmission directions for light from the light source can be widened even further than before.

DETAILED DESCRIPTION OF THE INVENTION

First Embodiment

Figure 1:
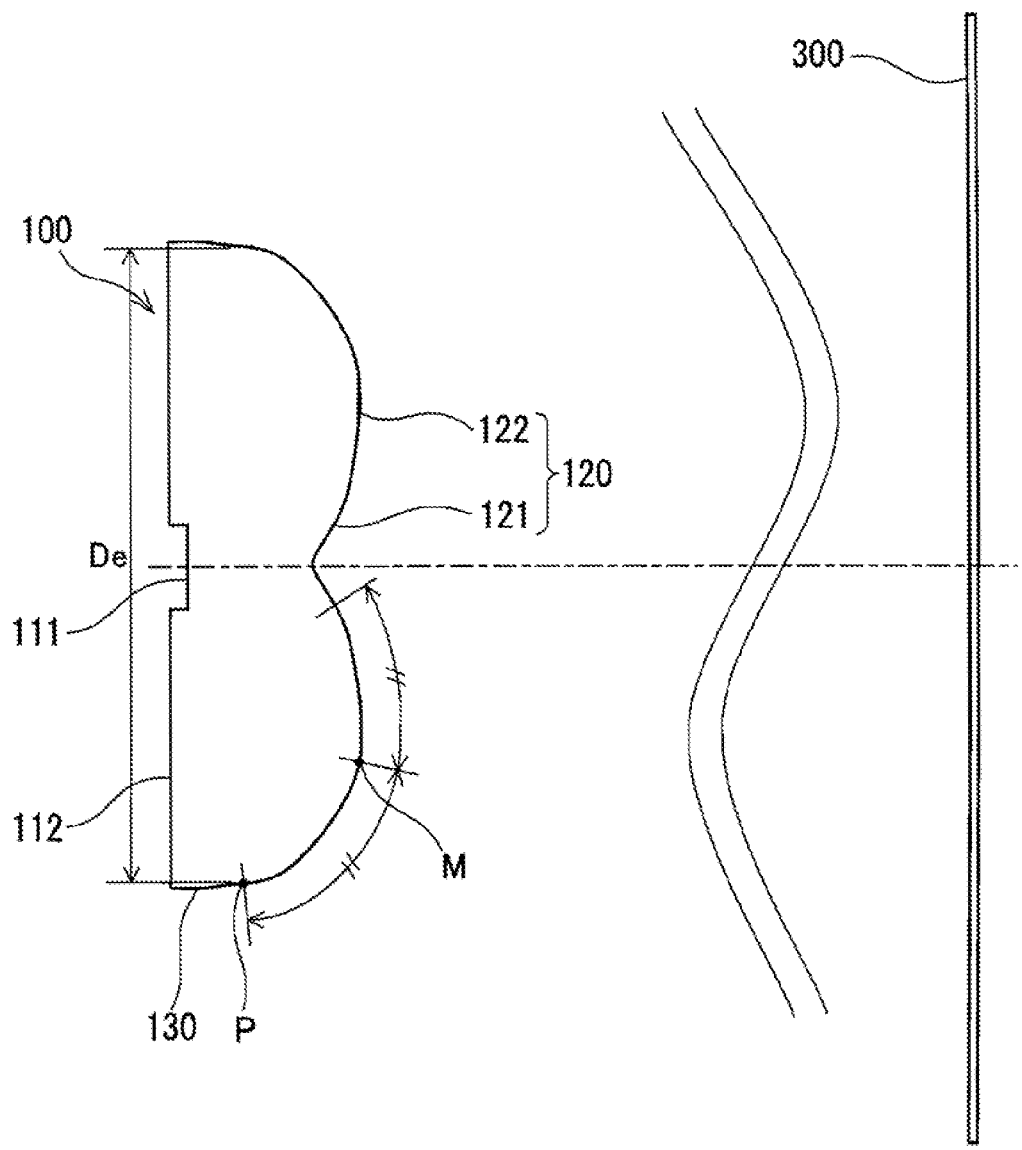
FIG. 1 is a schematic diagram of an illuminating lens according to a first embodiment of the present invention.

An illuminating lens according to the first embodiment of the present invention will be described with reference to the accompanying drawings. FIG. 1 is a schematic diagram of an illuminating lens 100 according to the first embodiment. The illuminating lens 100, which is disposed between a light source (not shown in FIG. 1) having directivity and a surface to be irradiated 300, spreads light emitted from the light source and emits the spread light to the surface to be irradiated 300. That is, the illuminating lens 100 widens the range of transmission directions for light from the light source. In the illuminance distribution on the surface to be irradiated 300, the illuminance is greatest on the optical axis A that is the design center line of the illuminating lens 100 and decreases almost monotonically toward the edge. The light source and the illuminating lens 100 are disposed so that their optical axes coincide with each other.

Specifically, the illuminating lens 100 has a light entrance surface 111 through which the light emitted from the light source enters the lens and a light exit surface 120 through which the light that has entered the lens exits the lens. The illuminating lens 100 has a bottom surface 112 surrounding the light entrance surface 111 and facing oppositely to the light exit surface 120. The illuminating lens 100 further has an outer peripheral surface 130 located outwardly of the light exit surface 120 to connect the periphery of the light exit surface 120 and the outer edge of the bottom surface 112.

The light entrance surface 111 need not be rotationally symmetric with respect to the optical axis. In the present embodiment, the light entrance surface 111 is located closer to the light exit surface 120 than the annular bottom surface 112 surrounding the light entrance surface 111, and the light source is fitted in the recess formed by the level difference between the surfaces 111 and 112. The light entrance surface 111 and the bottom surface 112 may be located on the same level. In this case, the light entrance surface 111 is the area that is connected optically to the light source. The light entrance surface 111 need not necessarily be joined directly to the light source. For example, the light entrance surface 111 may be recessed in a hemispherical shape so that an air space is formed between the light entrance surface 111 and the light source.

The light exit surface 120 is rotationally symmetric with respect to the optical axis. The light exit surface 120 is the area (area located inwardly of a point P shown in FIG. 1) for controlling at least a specified amount (for example, 90%) of light emitted from the light source. The diameter of the light exit surface 120 is the effective diameter De of the illuminating lens 100 when viewed from the optical axis direction.

Figure 7:
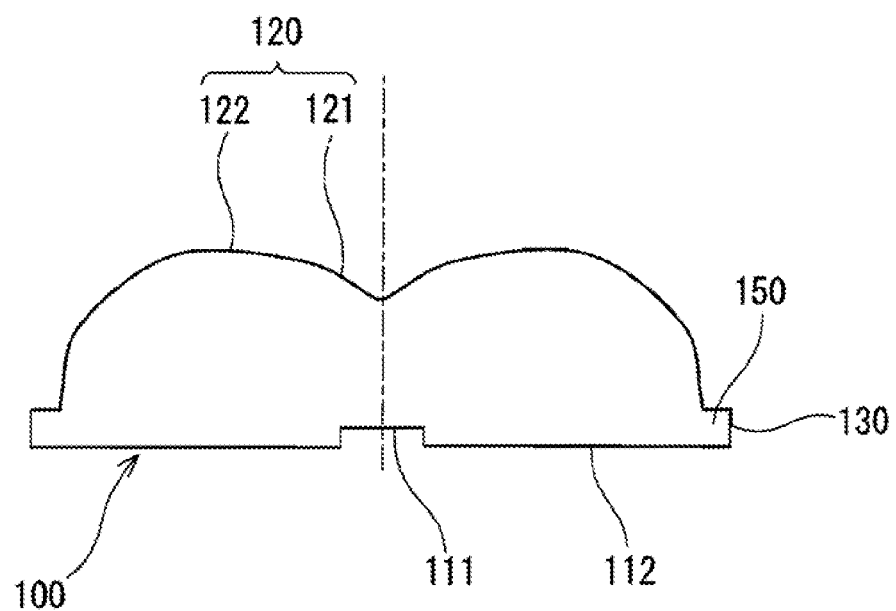
FIG. 7 is a schematic diagram of a modified illuminating lens.

The outer peripheral surface 130 forms a curved surface extending continuously from the light exit surface 120 in the present embodiment, but may be a tapered surface having a linear cross section. Alternatively, the illuminating lens 100 may be provided with a ring portion 150 projecting from the entire periphery of the light exit surface 120 so that the end surface of the ring portion 150 serves as the outer peripheral surface 130, as shown in FIG. 7, for example. The outer peripheral surface 130 need not be rotationally symmetric with respect to the optical axis. For example, the outer peripheral surface 130 may have a pair of flat portions that are parallel to each other across the optical axis such that the illuminating lens 100 has an oval shape when viewed from the optical axis direction.

The light emitted from the light source enters the illuminating lens 100 through the light entrance surface 111, exits the lens 100 through the light exit surface 120, and then reaches the surface to be irradiated 300. The light emitted from the light source is spread by the action of the light exit surface 120, and reaches a large area of the surface to be irradiated 300.

As the light source, for example, a light emitting diode can be used. Light emitting diodes usually are chips with a rectangular plate shape. Therefore, it is preferable that the light entrance surface 111 of the illuminating lens 100 have a shape conforming to the shape of a light emitting diode to fit in close contact with the light emitting diode. The light emitting diode is in contact with the light entrance surface 111 of the illuminating lens 100 via a bonding agent, and connected optically to the light entrance surface 111. The light emitting diode usually is covered with a sealing resin to avoid contact with air. As a conventional sealing resin for a light emitting diode, an epoxy resin, silicone rubber, or the like is used.

The illuminating lens 100 is made of a transparent material having a specified refractive index. The refractive index of the transparent material is, for example, about 1.4 to 1.53. Examples of such a transparent material include resins such as epoxy resin, silicone resin, acrylic resin, and polycarbonate, and rubbers such as silicone rubber. Particularly, it is preferable to use epoxy resin, silicone rubber, or the like that has been used as a sealing resin for a light emitting diode.

The light exit surface 120 includes a concave portion 121 intersecting the optical axis and a convex portion 122 provided around the concave portion 121 to extend continuously from the concave portion 121. Light enters the illuminating lens 100 through the light entrance surface 111 at a wide range of angles. Light that has entered the lens at a small angle with respect to the optical axis reaches the concave portion 121, and light that has entered the lens at a larger angle with respect to the optical axis reaches the convex portion 122.

For more detail, the light exit surface 120 is formed in a shape such that the curvature C of micro-segments of the light exit surface 120 in a cross section including the optical axis has a maximum value at a position outward from the midpoint (point M indicated in FIG. 1) of the convex portion 122.

Figure 4:
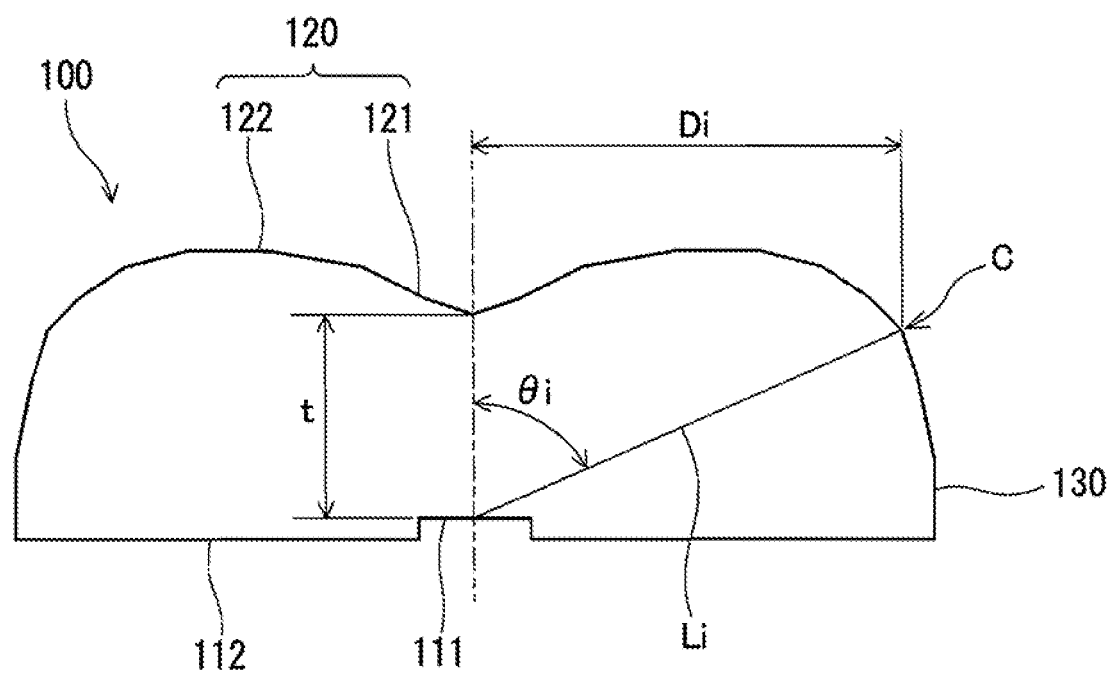
FIG. 4 is a diagram for explaining a curvature C of micro-segments on a light exist surface and θi indicating the position of one of the micro-segments.

The curvature C of the micro-segments is described below with reference to FIG. 4 and FIGS. 5A and 5B. FIG. 4 shows the curvature C of micro-segments of the light exist surface 120 and an angle $\theta i$ indicating the position of one of the micro-segments. The curvature C of micro-segments is defined as follows based on the position of the light source on the optical axis. The "position of the light source on the optical axis" is a position at which the optical axis intersects the light emitting surface of the light source.

Figure 5A:
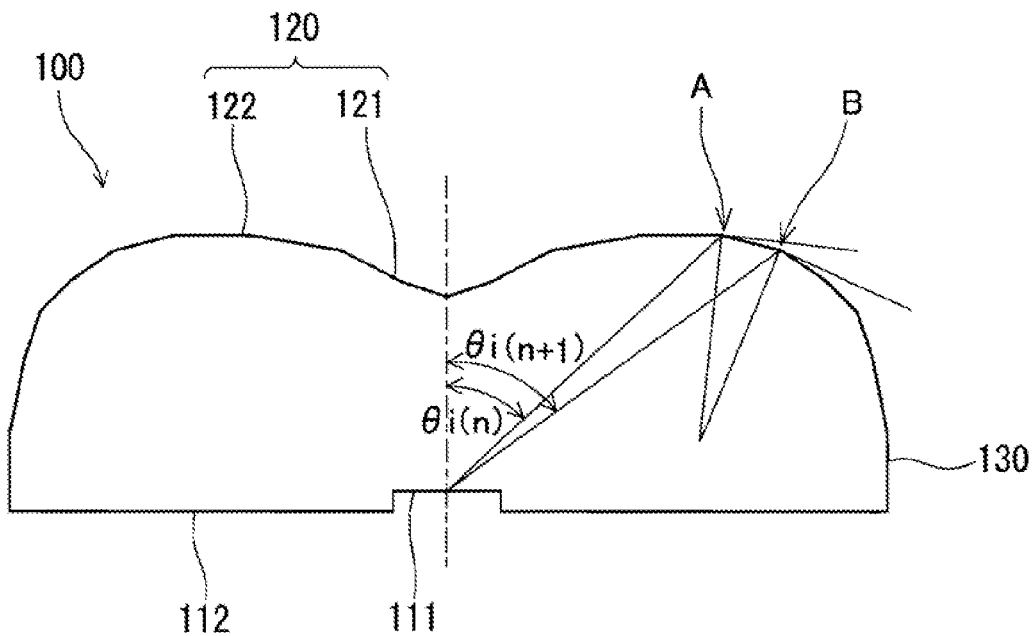
FIG. 5A is a diagram for explaining a method of deriving a curvature C of micro-segments.
Figure 5B:
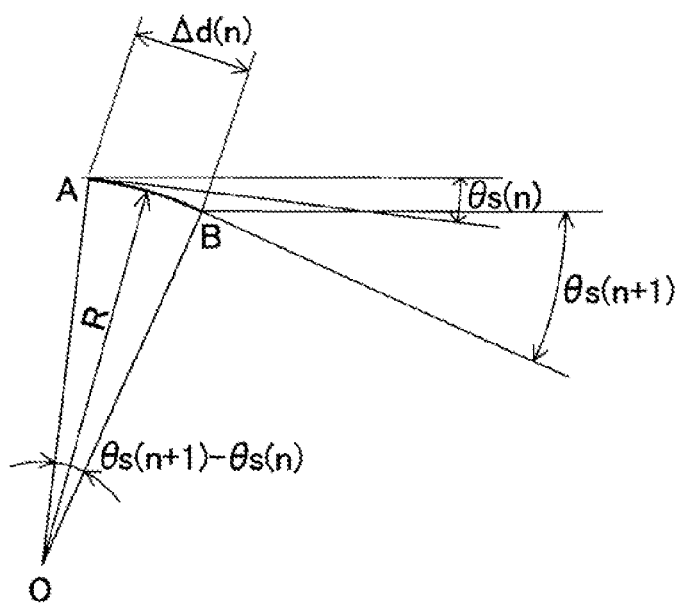
FIG. 5B is an enlarged view of one of the micro-segments.

As shown in FIGS. 5A and 5B, a micro-segment between a point A and a point B on the light exit surface 120 is assumed to be an n-th micro-segment from the optical axis. In this case, an angle between the optical axis and a line connecting the point A and the position of the light source on the optical axis is denoted as $\theta i(n)$, and an angle between the optical axis and a line connecting the point B and the position of the light source on the optical axis is denoted as $\theta i(n+1)$, where $\theta i(n+1)-\theta i(n)$ is about 0.5 degrees. An angle between a tangent at the point A on the light exit surface 120 and a surface perpendicular to the optical axis is denoted as $\theta s(n)$, and an angle between a tangent at the point B on the light exit surface 120 and a surface perpendicular to the optical axis is denoted as $\theta s(n+1)$. The length of a section between the point A and the point B on the light exit surface 120 is denoted as $\Delta d(n)$. Assuming that the A-B section of the light exit surface 120, which is assumed to be sufficiently small, is represented by a single curvature radius R, since the center O of the radius R is a point of intersection of a normal at the point A on the light exit surface 120 and a normal at the point B on the light exit surface 120, an angle $\angle AOB$ between these two normals can be represented as $\theta s(n+1)-\theta s(n)$. The radius R of the arc between the point A and the point B with O being the center thereof can be represented as $\Delta d(n)/\theta s(n+1)-\theta s(n)$. The curvature C is $1/R$. Accordingly, the curvature C of the n-th micro-segment is represented as $(\theta s(n+1)-\theta s(n))/\Delta d(n)$. In this case, $\theta s(n)$ and $\theta s(n+1)$ are defined by the radian measure. In the above definitions, the sign of the curvature C is positive when the center of curvature O is located on the light source side of the light exit surface 120, and negative when the center of curvature O is located on the opposite side.

According to the present embodiment, it is possible to obtain the illuminating lens 100 capable of emitting light that has entered the lens through the light entrance surface 111 through the light exit surface 120 toward a larger area.

The object of the present invention is achieved by the above-mentioned configuration. It is more preferable, however, from a functional viewpoint, that the illuminating lens 100 of the present embodiment satisfies the following conditional items.

It is preferable that the curvature C of the micro-segments of the light exit surface 120 in the cross section including the optical axis has the maximum value under the condition defined by the following inequality (1):

$$60° < \theta i < 80° \quad (1)$$

$$\text{(more preferably, } 65° < \theta i < 75°\text{)} \quad (1)'$$

where $\theta i$ is the angle between the optical axis and the line Li connecting the position of the light source on the optical axis and the center of each of the micro-segments, that is, $\theta i \approx (\theta i(n+1)+\theta i(n))/2$ (see FIG. 4).

The inequality (1) (or the inequality (1)') defines the shape of the light exit surface 120 based on the premise that a light ray emitted from the light source is incident at the position on the light exit surface 120 in the direction of $\theta i$ from the position of the light source.

If the value of $\theta i$ exceeds the upper limit of the inequality (1) (or the inequality (1)'), closer tolerances are required to maintain the light distribution characteristic, which increases the unevenness of in-plane brightness in the case of a surface light source. If the value of θi is less than the lower limit, the light distribution characteristic deteriorates, which increases the unevenness of in-plane brightness in the case of a surface light source.

Alternatively, it is preferable that the curvature C of the micro-segments of the light exit surface in the cross section including the optical axis has the maximum value under the condition defined by the following inequality (2):

$$0.88 < Yr < 0.98 \quad (2)$$

$$\text{(more preferably, } 0.90 < Yr < 0.96 \quad (2)'$$

where Yr is the ratio of the distance Di from the optical axis to the center of each of the micro-segments with respect to half the effective diameter De of the illuminating lens 100, that is, Di/0.5 De (see FIG. 4).

The inequality (2) (or the inequality (2)') defines the shape of the light exit surface 120 based on the premise that a light ray emitted from the light source is incident at the position on the light exit surface 120 with a ratio Yr.

If the value of Yr exceeds the upper limit of the inequality (2) (or the inequality (2)'), closer tolerances are required to maintain the light distribution characteristic, which increases the unevenness of in-plane brightness in the case of a surface light source. If the value of Yr is less than the lower limit, the light distribution characteristic deteriorates, which increases the unevenness of in-plane brightness in the case of a surface light source.

Figure 6:
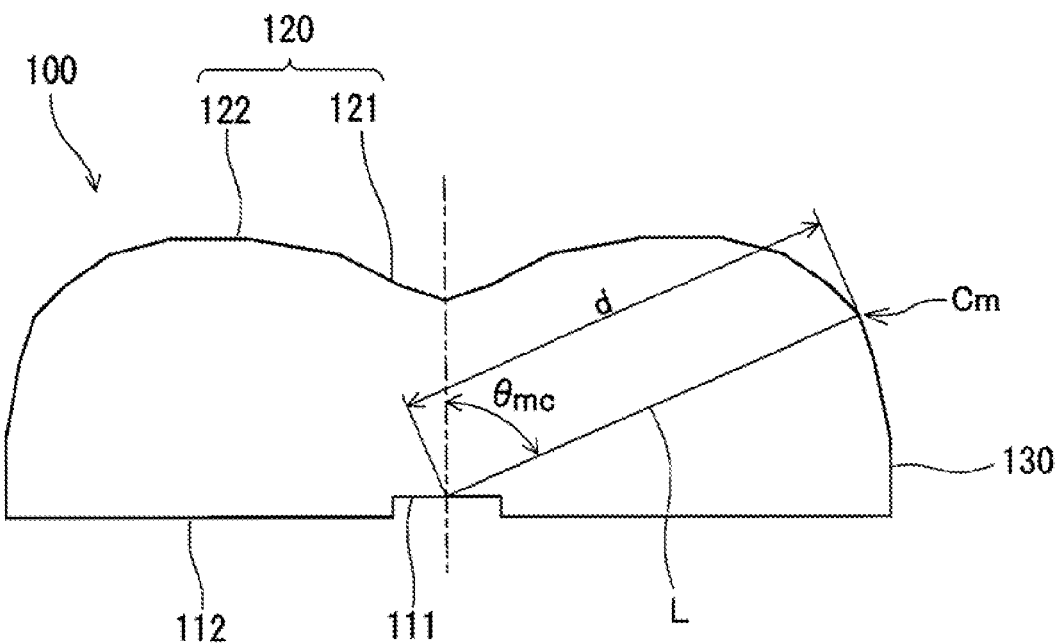
FIG. 6 is a diagram for explaining parameters of an inequality (4).

Furthermore, it is preferable that the light exit surface 120 satisfies the following inequality (3):

$$0.90 < \theta mp/\theta mc < 1.05 \quad (3)$$

$$\text{(more preferably, } 0.92 < \theta mp/\theta mc < 1.03 \quad (3)'$$

where θmc is the angle between the optical axis and the line L connecting the position of the light source on the optical axis and the center of a micro-segment in which the curvature C has a maximum value among the micro-segments, and θmp is, among emission angles that are angles between light rays emitted from the light exit surface 120 and the optical axis, the emission angle having a maximum luminous intensity, where the light rays are sorted by respective emission angles (see FIG. 6).

The inequality (3) (or the inequality (3)') defines the ratio between θmp and θmc. If the value of θmp/θmc exceeds the upper limit of the inequality (3) (or the inequality (3)'), the angle of θmp is excessively large with respect to the angle θmc, which causes a decrease in the light emission intensity, and thus the light distribution characteristic deteriorates. If the value of θmp/θmc is less than the lower limit, the light distribution characteristic varies in a wave-like manner, which causes uneven brightness.

Furthermore, it is preferable that the light exit surface satisfies the following inequality (4):

$$0.9 < Cm \times (n-1) \times d < 1.5 \quad (4)$$

$$\text{(more preferably, } 0.95 < Cm \times (n-1) \times d < 1.45 \quad (4)'$$

where Cm is the maximum value of the curvature C of the micro-segments, n is the refractive index of the illuminating lens 100, and d is the distance from the position of the light source on the optical axis to the center of a micro-segment in which the curvature C has a maximum value among the micro-segments, that is, the length of the line L (see FIG. 6).

In the inequality (4) (or the inequality (4)'), the maximum value of the curvature is normalized with respect to the distance from the position of the light source to the light exit surface 120 to define the shape of the light exit surface 120. If the value of Cm×(n−1)×d exceeds the upper limit of the inequality (4) (or the inequality (4)'), the light emission intensity decreases at an angle at which the light emission intensity has a maximum value. If the value of Cm×(n−1)×d is less than the lower limit, the light emission intensity decreases at an angle at which the light emission intensity has a maximum value.

Furthermore, it is preferable that if a sag amount of the light exit surface 120 is a height from a position where the light exit surface 120 intersects the optical axis, the light exit surface 120 satisfies the following inequalities (5) and (6):

$$5° < \theta o < 20° \quad (5): \text{and}$$

$$25° < \theta s < 45° \quad (6)$$

$$\text{(more preferably, } 10° < \theta o < 15° \quad (5)': \text{and}$$

$$30° < \theta s < 40° \quad (6)'$$

where θo is the angle between the optical axis and the line connecting the position of the light source on the optical axis and the position at which the sign of the curvature C on the light exit surface 120 changes from negative to positive, and θs is the angle between the optical axis and the line connecting the position of the light source on the optical axis and the position at which the sag amount on the light exit surface has a maximum value.

The sign of the curvature C is positive when the light exit surface 120 is located on the side opposite to the light source, and negative when the surface 120 is located on the light source side, with respect to the point of intersection of the optical axis and the light exit surface 120.

The inequality (5) (or the inequality (5)') and the inequality (6) (or the inequality (6)') define the shape of the light exit surface 120.

If the value of θo exceeds the upper limit of the inequality (5) (or the inequality (5)'), the incident angle of the light ray on the light exit surface 120 is excessively large, and is totally reflected. As a result, a desired brightness distribution cannot be obtained, which increases the unevenness of in-plane brightness in the case of a surface light source. If the value of θo is less than the lower limit, the amount of the light ray directed to the center of the surface to be irradiated 300 is high, which increases the unevenness of in-plane brightness in the case of a surface light source.

If the value of θs exceeds the upper limit of the inequality (6) (or the inequality (6)'), closer tolerances are required to maintain the light distribution characteristic. If the value of θs is less than the lower limit, the light distribution characteristic deteriorates, which increases the unevenness of in-plane brightness in the case of a surface light source.

Furthermore, it is preferable that the light exit surface 120 is formed as a continuous surface except for a point on the optical axis. The area near the optical axis of the concave portion 121 on the light exit surface 120 may be recessed toward a point on the optical axis. The area also may be curved smoothly to cross the optical axis at right angles.

With such a configuration, a smooth brightness distribution can be obtained in the case of a surface light source, and thus the unevenness of brightness can be reduced.

Furthermore, it is preferable that the illuminating lens 100 satisfies the following inequality (7):

$$1.40 < n < 1.52 \quad (7)$$

where n is the refractive index of the illuminating lens 100.

The inequality (7) defines the refractive index of the illuminating lens.

If the value of n exceeds the upper limit of the inequality (7), the refraction effect of the light exit surface 120 increases, which causes an insufficient light distribution characteristic. If the value of n is less than the lower limit, the refraction effect of the light exit surface 120 decreases. Therefore, if the shape of the light exit surface 120 is changed to increase the refraction effect, closer tolerances are required.

Figure 3:
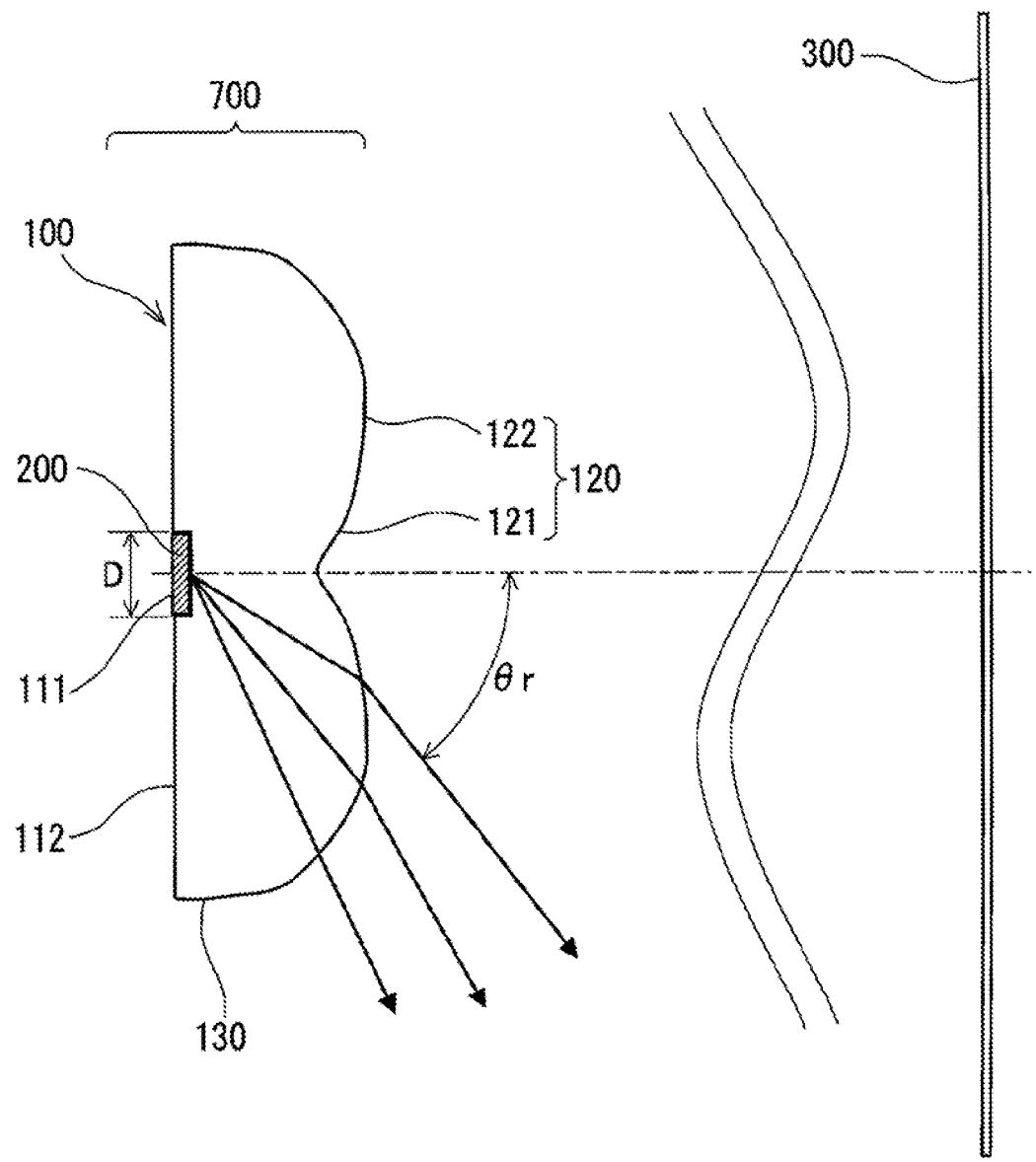
FIG. 3 is a diagram showing optical paths of light rays emitted from the lighting device according to the second embodiment of the present invention.

Furthermore, as shown in FIG. 3, it is preferable that in the case where a light ray emitted from the position of the light source on the optical axis at an angle of θi with respect to the optical axis is refracted at the light exit surface 120 at an angle of θr with respect to the optical axis, a variation Δθr in the angle θr with respect to an increment Δθi in the angle θi (Δθr/Δθi) with an increase in the angle θi increases and decreases repeatedly.

Since the light source has a light emitting surface of a certain size, light emitted from the peripheral portion of the light emitting surface is totally reflected at the light exit surface 120. In the illuminance distribution, the illuminance decreases locally due to this total reflection of light. However, light rays can be guided to the low illuminance region by designing the lens to satisfy the above condition of Δθr/Δθi and to adjust the density of light rays. As a result, a smooth illuminance distribution can be obtained.

Second Embodiment

Figure 2:
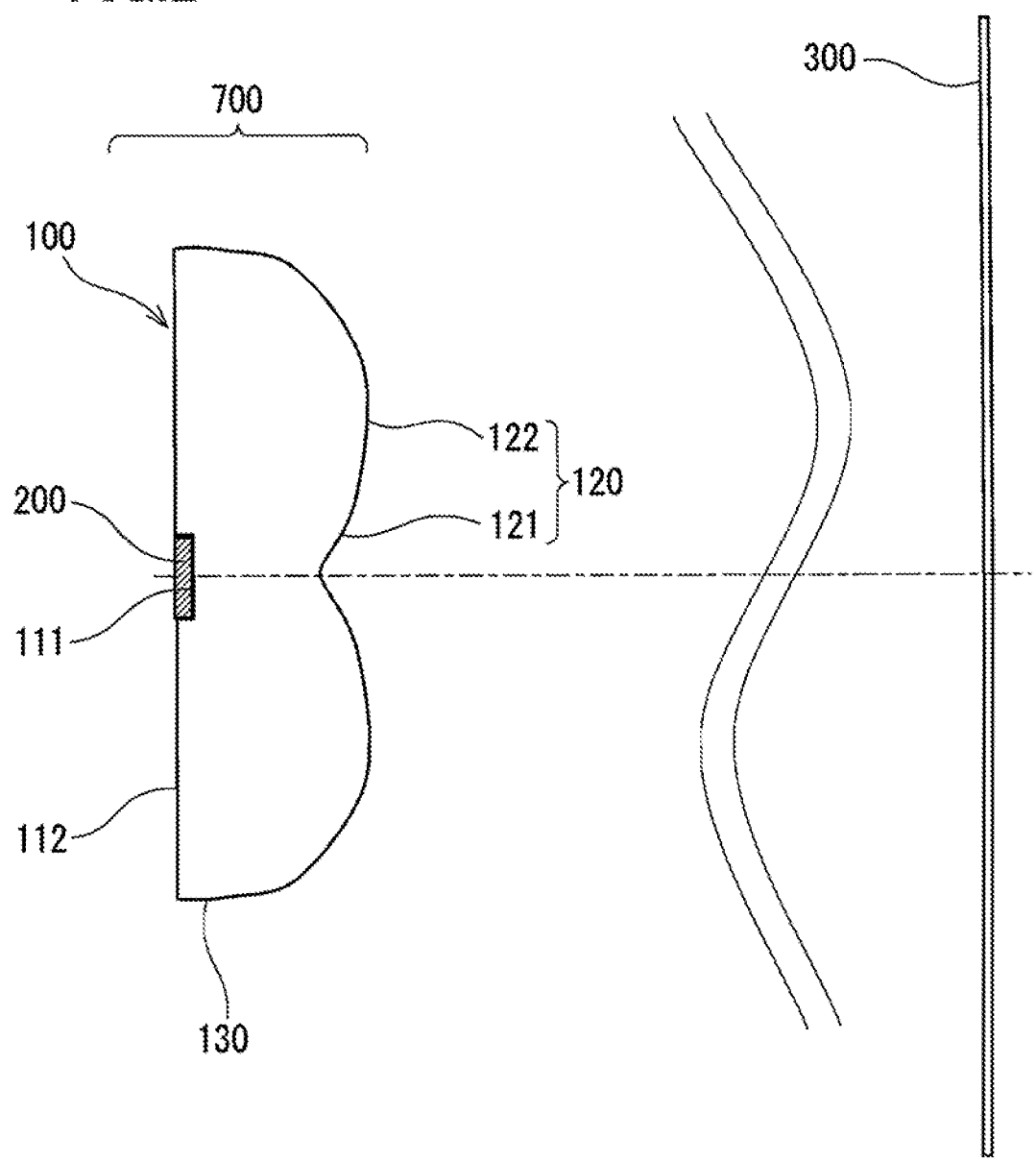
FIG. 2 is a schematic diagram of a lighting device according to a second embodiment of the present invention.

FIG. 2 is a schematic diagram of a lighting device 700 according to a second embodiment of the present invention. This lighting device 700 includes a light emitting diode 200 for emitting light, and the illuminating lens 100 described in the first embodiment for spreading light emitted from the light emitting diode 200 so that the surface to be irradiated 300 is irradiated with the spread light.

The light emitting diode 200 is in contact with the light entrance surface 111 of the illuminating lens 100 via a bonding agent, and connected optically to the light entrance surface 111. The light that has exited the illuminating lens 100 through the light exit surface 120 reaches the surface to be irradiated 300, and thus the surface to be irradiated 300 is illuminated with that light.

Light generation in the light emitting diode 200 has no directivity in itself, and a light emitting region has a refractive index of at least 2.0. When light from the light emitting region enters a low refractive region, the refraction of the light at the interface causes the light to have the maximum intensity in the normal direction of the interface and to have a lower intensity as the angle of the light with respect to the normal increases. As described above, since the light emitting diode 200 has high directivity, it is necessary to widen the range of transmission directions for light therefrom using the illuminating lens 100 to illuminate a larger area.

FIG. 3 is a diagram showing the paths of light rays in the lighting device 700. The light that has been emitted from the light emitting diode 200 passes through the light entrance surface 111 and reaches the light exit surface 120. The light that has reached the light exit surface 120 passes through the light exit surface 120 while being refracted, and then reaches the surface to be irradiated 300.

It is preferable that the lighting device 700 satisfies the following inequality (8):

$$0.3 < D/t < 0.9 \quad (8)$$

$$(\text{more preferably, } 0.37 < D/t < 0.87) \quad (8)'$$

where D is the maximum width of the light emitting surface of the light emitting diode 200 (the length of each side of the light emitting surface if it is a square, and the length of the longer side of the light emitting surface if it is a rectangle), and t is the center thickness of the illuminating lens 100 (the distance from the light entrance surface 111 to the light exit surface 120 on the optical axis) (see FIG. 3 and FIG. 4).

The inequality (8) (or the inequality (8)') defines the maximum width of the light emitting surface of the light emitting diode 200 with respect to the center thickness of the illuminating lens 100.

If the value of D/t exceeds the upper limit of the inequality (8) (or the inequality (8)'), the size of the light emitting diode 200 is excessively large with respect to the size of the illuminating lens 100. Therefore, light rays directed to the light exit surface 120 are incident on the surface 120 at large angles, and are totally reflected. As a result, a desired brightness distribution cannot be obtained, which increases the unevenness of in-plane brightness in the case of a surface light source. If the value of D/t is less than the lower limit, the size of the illuminating lens 100 is excessively large with respect to the size of the light emitting diode 200. Therefore, the lighting device increases in size, which causes an increase in cost.

Furthermore, it is preferable that the lighting device 700 satisfies the following inequality (9):

$$0.06 < D/De < 0.27 \quad (9)$$

$$(\text{more preferably, } 0.09 < D/De < 0.24) \quad (9)'$$

where D is the maximum width of the light emitting surface of the light emitting diode 200, and De is the effective diameter of the illuminating lens 100.

The inequality (9) (or the inequality (9)') defines the maximum width of the light emitting surface of the light emitting diode 200 with respect to the effective diameter of the illuminating lens 100. If the value of D/De exceeds the upper limit of the inequality (9) (or the inequality (9)'), the size of the light emitting diode 200 is excessively large with respect to the effective diameter of the illuminating lens 100. Therefore, light rays directed to the light exit surface 120 are incident on the surface 120 at large angles, and are totally reflected. As a result, a desired brightness distribution cannot be obtained, which increases the unevenness of in-plane brightness in the case of a surface light source. If the value of D/De is less than the lower limit, the effective diameter of the illuminating lens 100 is excessively large with respect to the size of the light emitting diode 200. Therefore, the lighting device increases in size, which causes an increase in cost.

EXAMPLES

Hereinafter, Examples 1 to 3 are given as specific numerical examples of the illuminating lens 100 used in the lighting device 700 according to the second embodiment.

In each of the following examples, the units of lengths are all millimeters (mm), and the units of angles are all degrees (°) in Tables below. In the surface data in each of the following examples, r is a curvature radius, d is a distance between surfaces or a thickness of a lens, and n is a refractive index with respect to a d line. In each of the following examples, surfaces marked with asterisks (*) are aspherical surfaces, and the shape of the aspherical surfaces is defined by the following equation:

$$X = \frac{C_j h^2}{1 + \sqrt{1 - (1 + K_j) C_j^2 h^2}} + \sum A_{j,n} h^n \quad \text{[Equation 1]}$$

where X is the distance from a point on an aspherical surface with a height h from the optical axis to a tangential plane at the vertex of the aspherical surface, h is the height from the optical axis, Cj is the curvature at the vertex of the j-th aspherical surface (Cj=1/Rj), Kj is the conical constant of the j-th surface, and Aj,n is the n-th order aspherical coefficient of the j-th surface.

Example 1

An illuminating lens of Example 1 has a shape corresponding to that shown in FIG. 3. Example 1 is an example of an illuminating lens designed to widen the range of transmission directions for light from a 0.5 mm cubic-shaped light emitting diode as a light source. Table 1 shows the surface data of the illuminating lens of Example 1, and Table 2 shows the aspherical surface data thereof.

TABLE 1

Surface data

| Surface number | r | d | n |
|---|---|---|---|
| Object surface | ∞ | 0.964 | 1.41 |
| 1* | 8.373E−13 | 7.036 | |
| Image surface | ∞ | | |

TABLE 2

Aspherical surface data
First surface

K = −1.0268E+01, A3 = 1.9628E+00, A4 = −8.3686E+00,
A5 = 1.9670E+01
A6 = −3.6276E+01, A7 = 4.6681E+01, A8 = −3.0918E+01,
A9 = −1.0909E−01
A10 = 1.0608E+01, A11 = −7.0489E−03, A12 = −4.5201E+00,
A13 = 1.2256E−02
A14 = 1.4688E+00, A15 = 3.4825E−04, A16 = −3.1939E−01,
A17 = −7.9209E−04
A18 = 4.0742E−02, A19 = 3.5721E−05, A20 = −2.2613E−03

Figure 8:
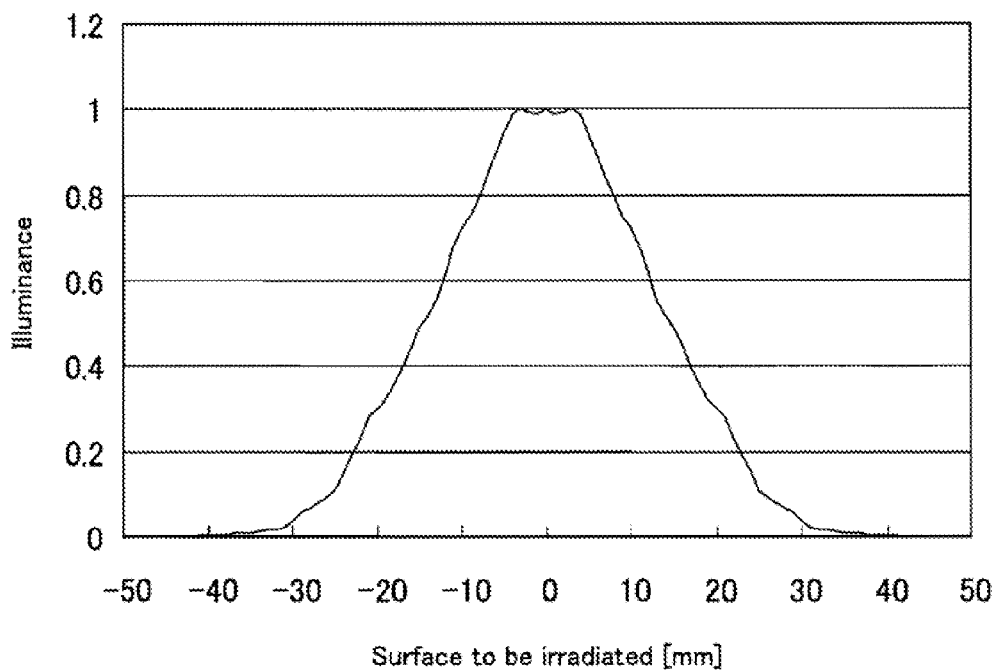
FIG. 8 shows an illuminance distribution obtained by using an illuminating lens of Example 1 in a lighting device.

FIG. 8 shows the illuminance distribution on the surface to be irradiated obtained by calculation assuming that the illuminating lens of Example 1 and the light emitting diode are used and the surface to be irradiated is placed at a distance of 8 mm from the light emitting surface of the light emitting diode.

Figure 9:
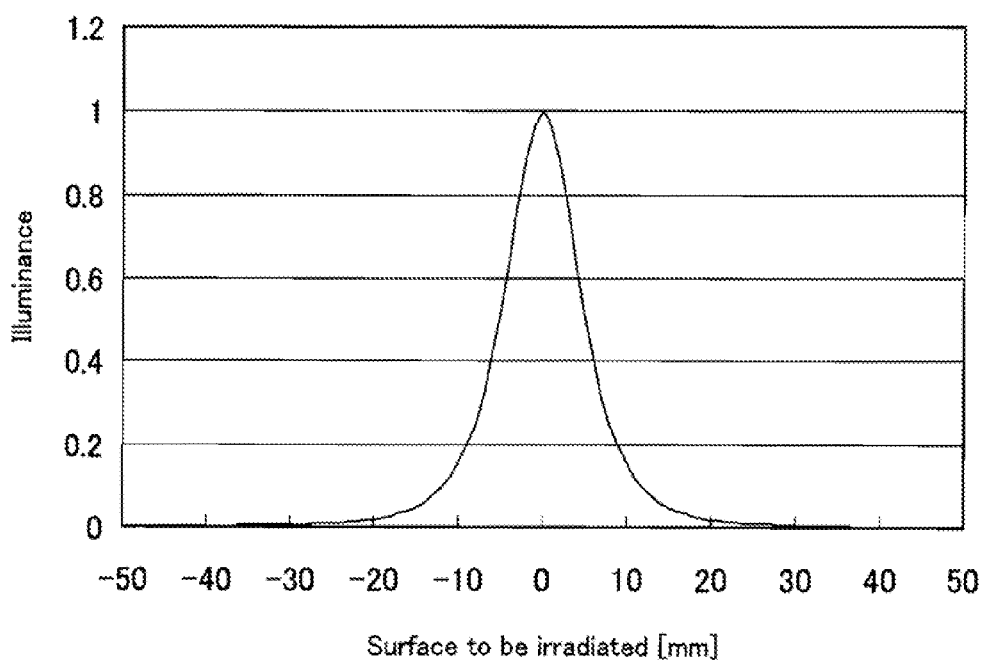
FIG. 9 shows an illuminance distribution obtained by using only light emitting diodes to confirm the effect of the illuminating lens of Example 1.

FIG. 9 shows the illuminance distribution on the surface to be irradiated obtained by calculation assuming that only the same light emitting diode is used and the surface to be irradiated is placed at a distance of 8 mm from the light emitting surface of the light emitting diode.

A comparison between FIG. 8 and FIG. 9 shows that the illuminating lens of Example 1 is effective in increasing the illuminated area of the surface to be irradiated.

Figure 10:
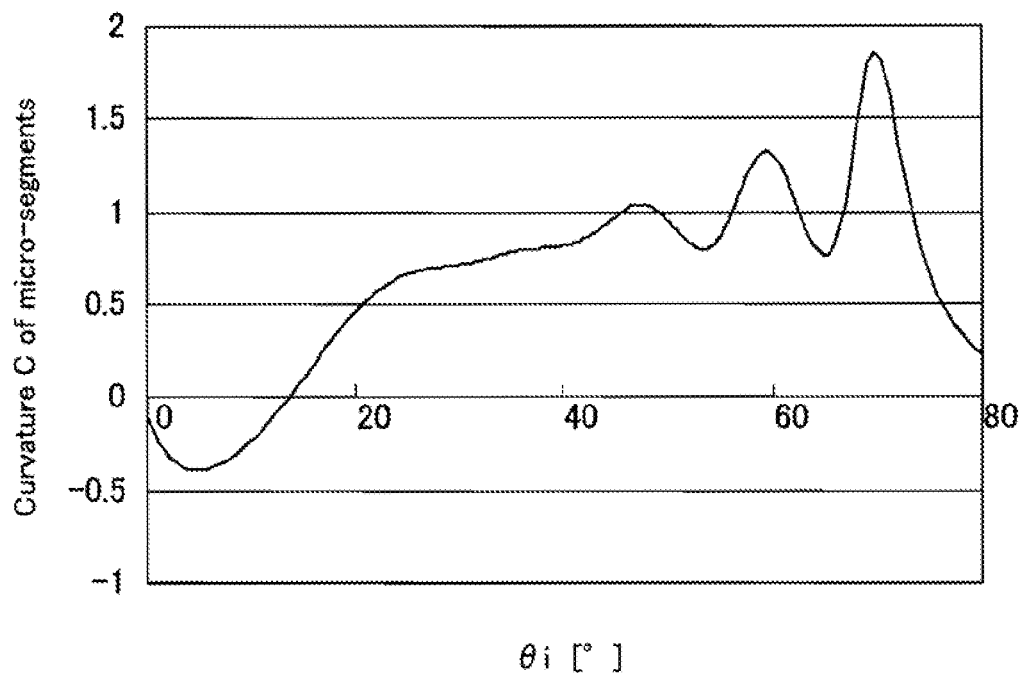
FIG. 10 is a diagram showing a relationship between θi and a curvature C of micro-segments of the illuminating lens of Example 1.

FIG. 10 shows the curvature C of micro-segments of the illuminating lens of Example 1. The horizontal axis represents the angle θi between the optical axis and the line Li connecting the center of each of the micro-segments and the position of the light source on the optical axis (see FIG. 4). The curvature C reverses its sign at 13.77 degrees, and has a maximum value at 69.8 degrees.

Figure 11:
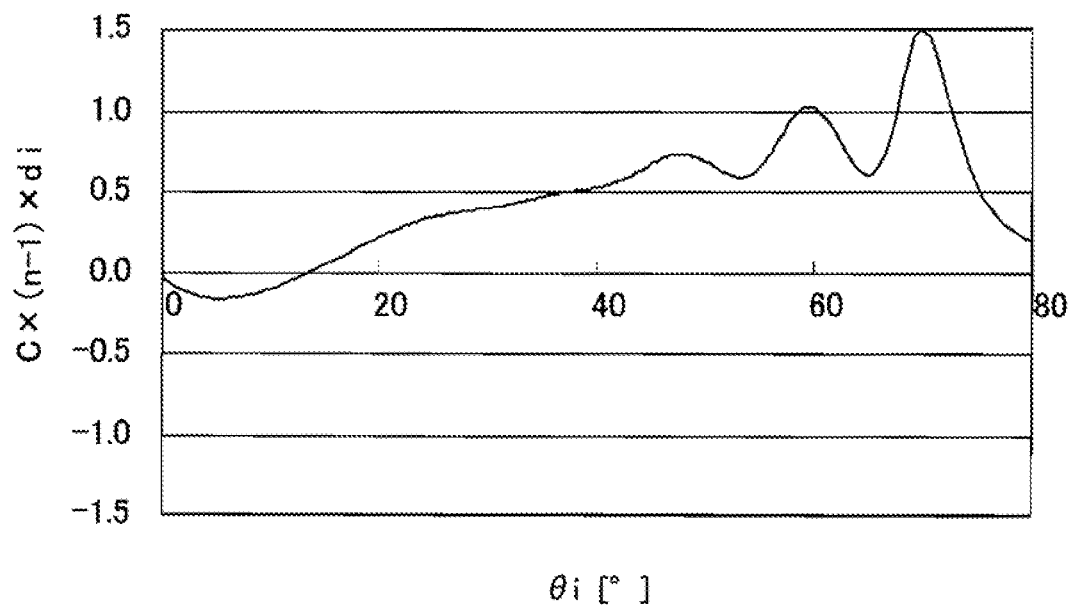
FIG. 11 is a diagram showing a relationship between θi and C×(n−1)×di of the illuminating lens of Example 1.

FIG. 11 shows C×(n−1)×di related to the inequality (4) for the illuminating lens of Example 1, where di represents the distance from the position of the light source on the optical axis to the center of each of the micro-segments, that is, the length of the line Li in FIG. 4.

C×(n−1)×di has a maximum value when the angle θi is 69.8 degrees, and the value is 1.51.

Figure 12:
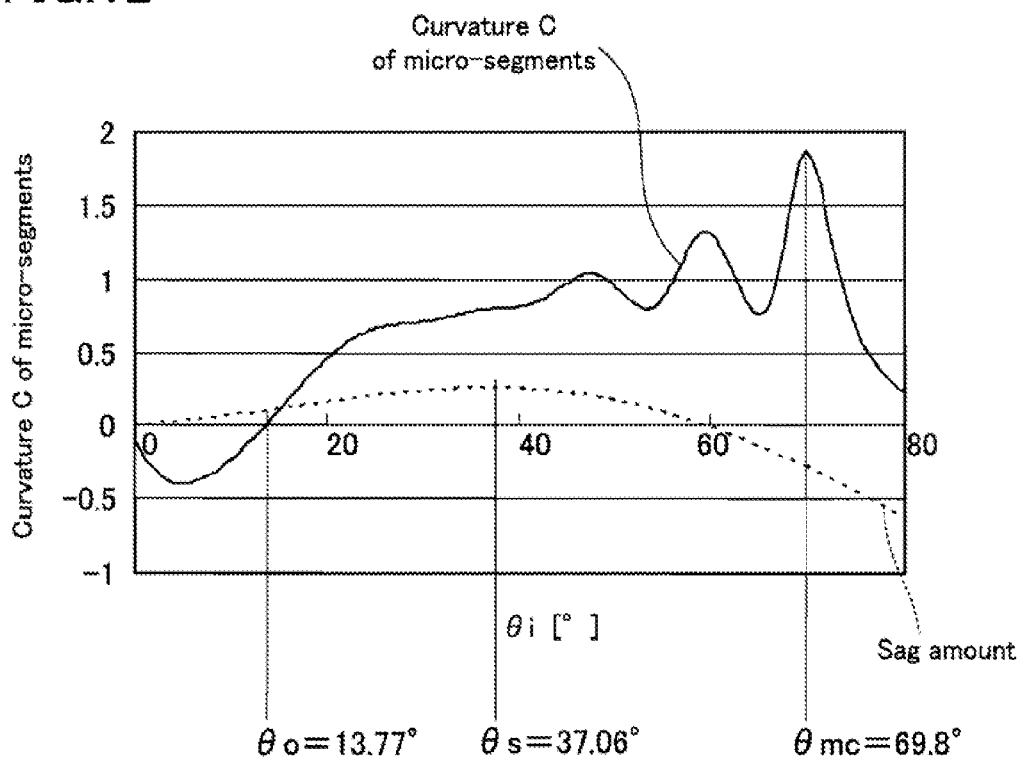
FIG. 12 is a diagram showing a relationship between θi, and a curvature C of micro-segments and a sag amount of the illuminating lens of Example 1.

FIG. 12 shows the curvature C of micro-segments and the sag amount of the illuminating lens of Example 1. The angles θo, θs, and θmc are 13.77 degrees, 37.06 degrees, and 69.8 degrees, respectively.

Figure 13:
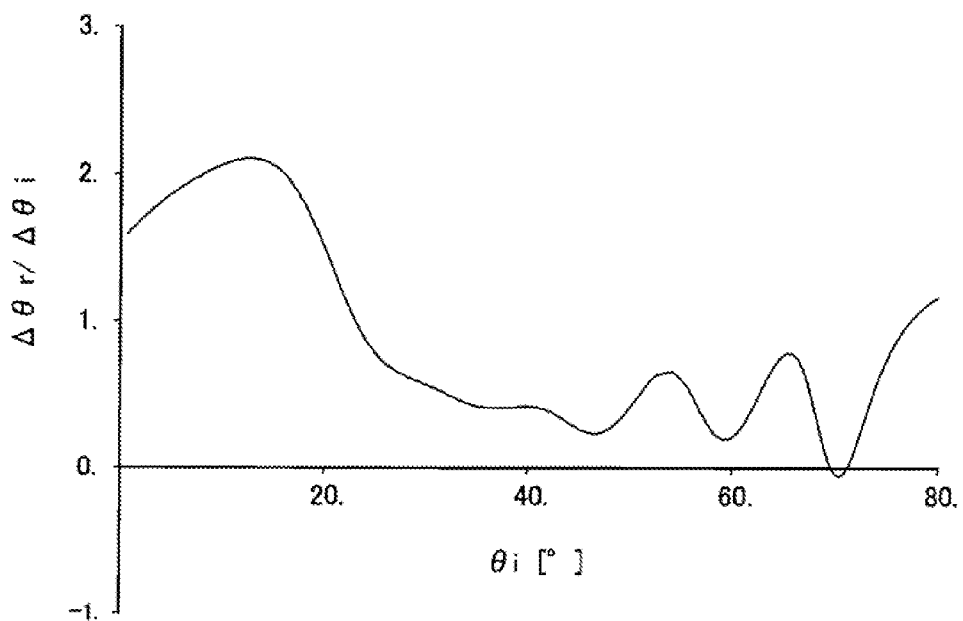
FIG. 13 is a diagram showing a relationship between θi and Δθr/Δθi of the illuminating lens of Example 1.

FIG. 13 shows a change in Δθr/Δθi with an increase in θi in the illuminating lens of Example 1. Δθr/Δθi changes in a waveform, and the distance between the waves becomes narrower as θi increases.

Figure 14:
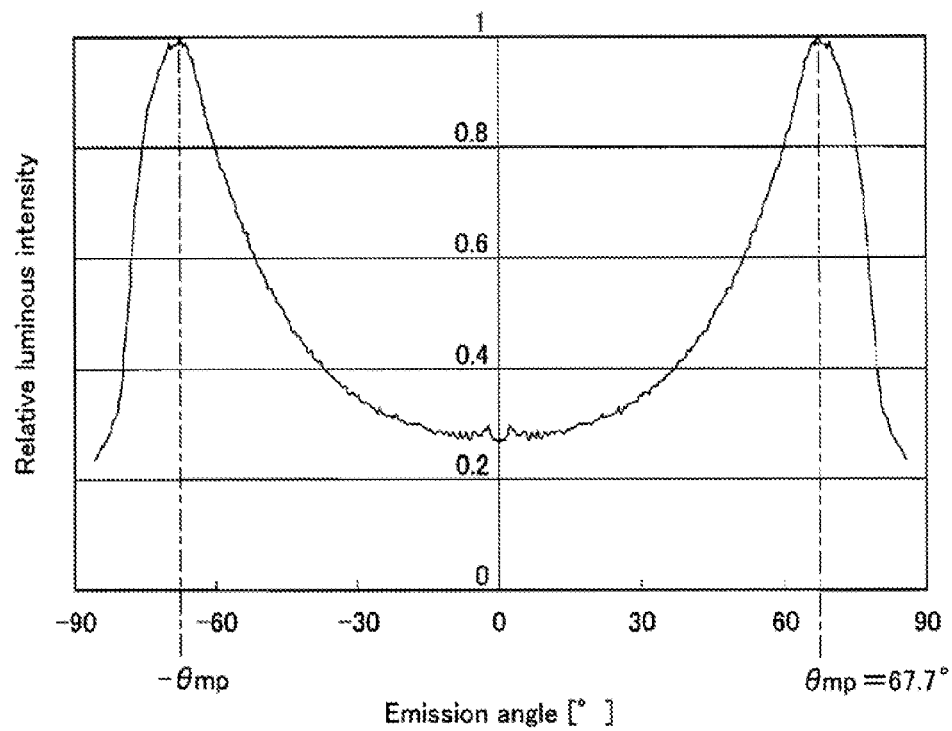
FIG. 14 shows a luminous intensity distribution of light emitted from the light exit surface of the illuminating lens of Example 1.

FIG. 14 shows relative luminous intensities of light rays emitted from the light exit surface of the illuminating lens of Example 1, where the light rays are sorted by respective emission angles. In FIG. 14, θmp is 67.7 degrees. Therefore, θmp/θmc is 0.97.

Example 2

An illuminating lens of Example 2 has a shape corresponding to that shown in FIG. 3. Example 2 is an example of an illuminating lens designed to widen the range of transmission directions for light from a 0.65 mm cubic-shaped light emitting diode as a light source. Table 3 shows the surface data of the illuminating lens of Example 2, and Table 4 shows the aspherical surface data thereof.

TABLE 3

Surface data

| Surface number | r | d | n |
|---|---|---|---|
| Object surface | ∞ | 1.2 | 1.41 |
| 1* | 1.088E−12 | 6.8 | |
| Image surface | ∞ | | |

TABLE 4

Aspherical surface data
First surface

K = −1.0268E+01, A3 = 1.5843E+00, A4 = −5.9328E+00,
A5 = 1.0800E+01
A6 = −1.3014E+01, A7 = 1.0470E+01, A8 = −4.6299E+00,
A9 = −2.1226E−02
A10 = 9.6894E−01, A11 = −7.9260E−02, A12 = −2.3661E−01,
A13 = −1.8210E−03
A14 = 6.4025E−02, A15 = 1.2197E−03, A16 = −1.0393E−02,
A17 = −1.3892E−04
A18 = 8.1619E−05, A19 = 6.2396E−04, A20 = −1.5184E−04

Figure 15:
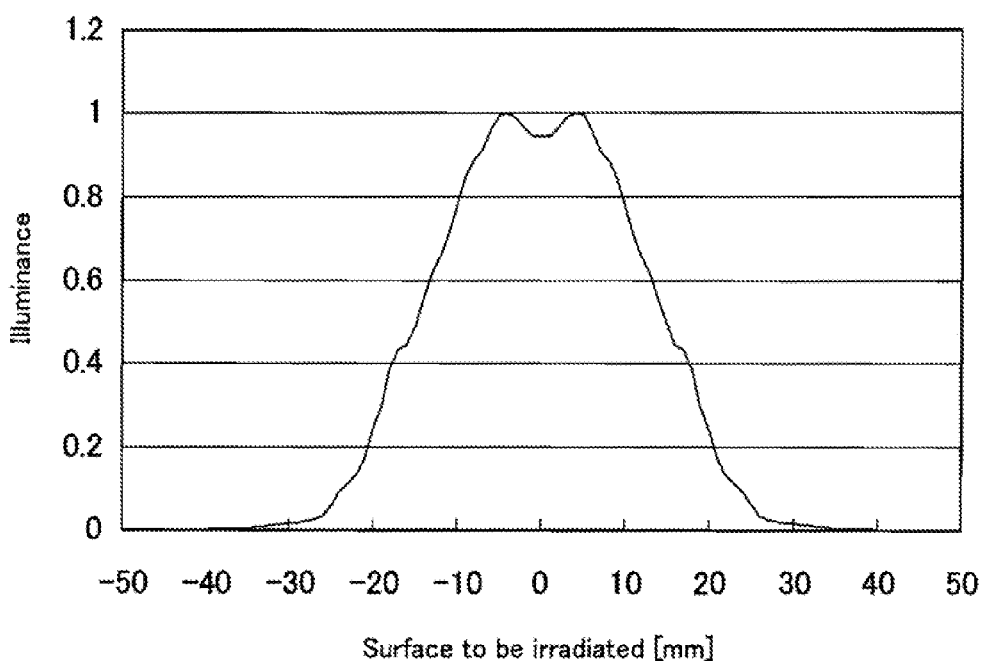
FIG. 15 shows an illuminance distribution obtained by using an illuminating lens of Example 2 in a lighting device.

FIG. 15 shows the illuminance distribution on the surface to be irradiated obtained by calculation assuming that the illuminating lens of Example 2 and the light emitting diode are used and the surface to be irradiated is placed at a distance of 8 mm from the light emitting surface of the light emitting diode.

Figure 16:
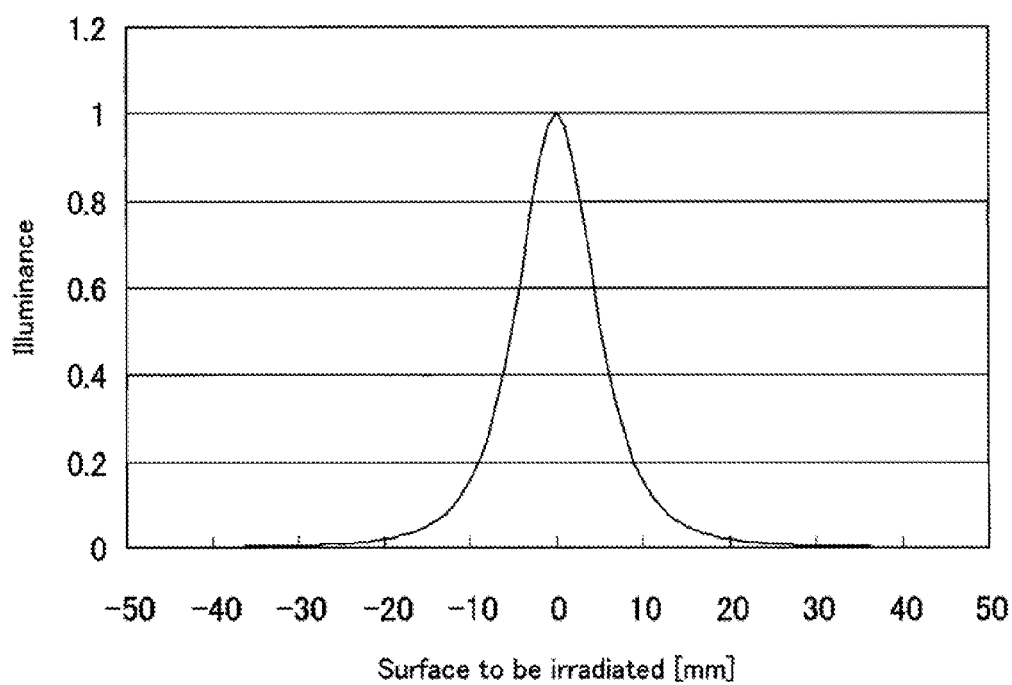
FIG. 16 shows an illuminance distribution obtained by using only light emitting diodes to confirm the effect of the illuminating lens of Example 2.

FIG. 16 shows the illuminance distribution on the surface to be irradiated obtained by calculation assuming that only the same light emitting diode is used and the surface to be irradiated is placed at a distance of 8 mm from the light emitting surface of the light emitting diode.

A comparison between FIG. 15 and FIG. 16 shows that the illuminating lens of Example 2 is effective in increasing the illuminated area of the surface to be irradiated.

Figure 17:
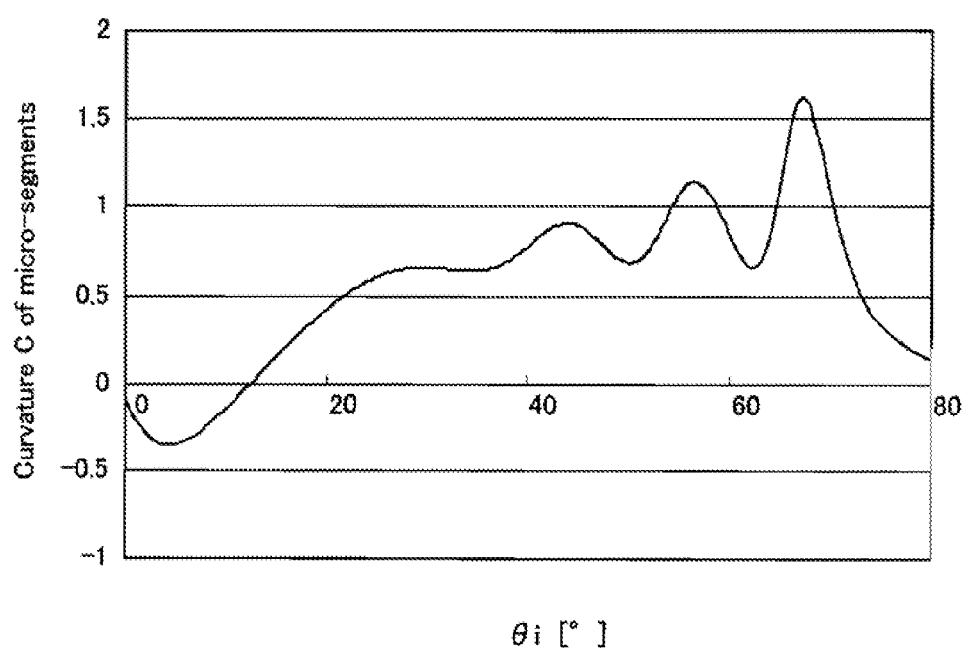
FIG. 17 is a diagram showing a relationship between θi and a curvature C of micro-segments of the illuminating lens of Example 2.

FIG. 17 shows the curvature C of micro-segments of the illuminating lens of Example 2. The horizontal axis represents the angle θi between the optical axis and the line Li connecting the center of each of the micro-segments and the position of the light source on the optical axis. The curvature C reverses its sign at 12.5 degrees, and has a maximum value at 67.2 degrees.

Figure 18:
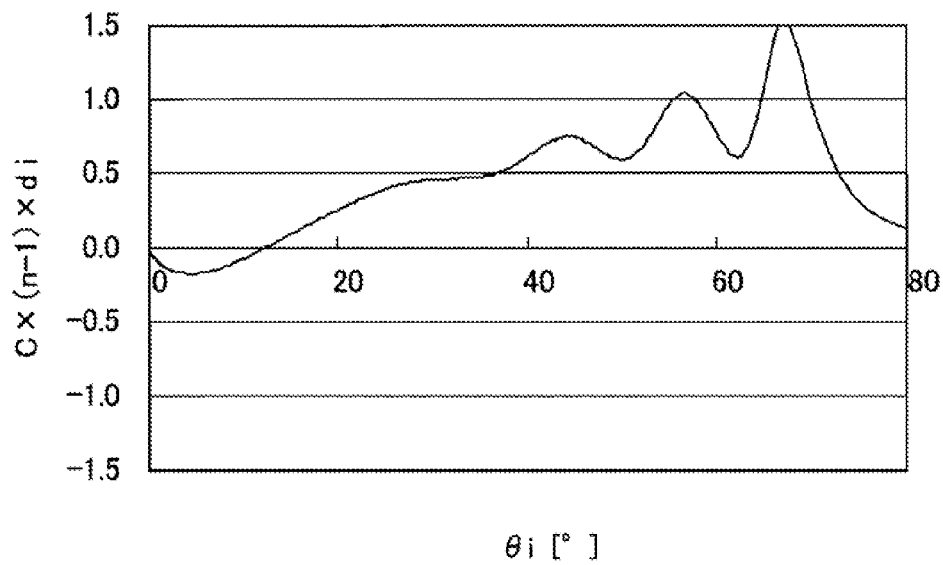
FIG. 18 is a diagram showing a relationship between θi and C×(n−1)×di of the illuminating lens of Example 2.

FIG. 18 shows C×(n−1)×di related to the inequality (4) for the illuminating lens of Example 2. C×(n−1)×di has a maximum value when the angle θi is 67.2 degrees, and the value is 1.53.

Figure 19:
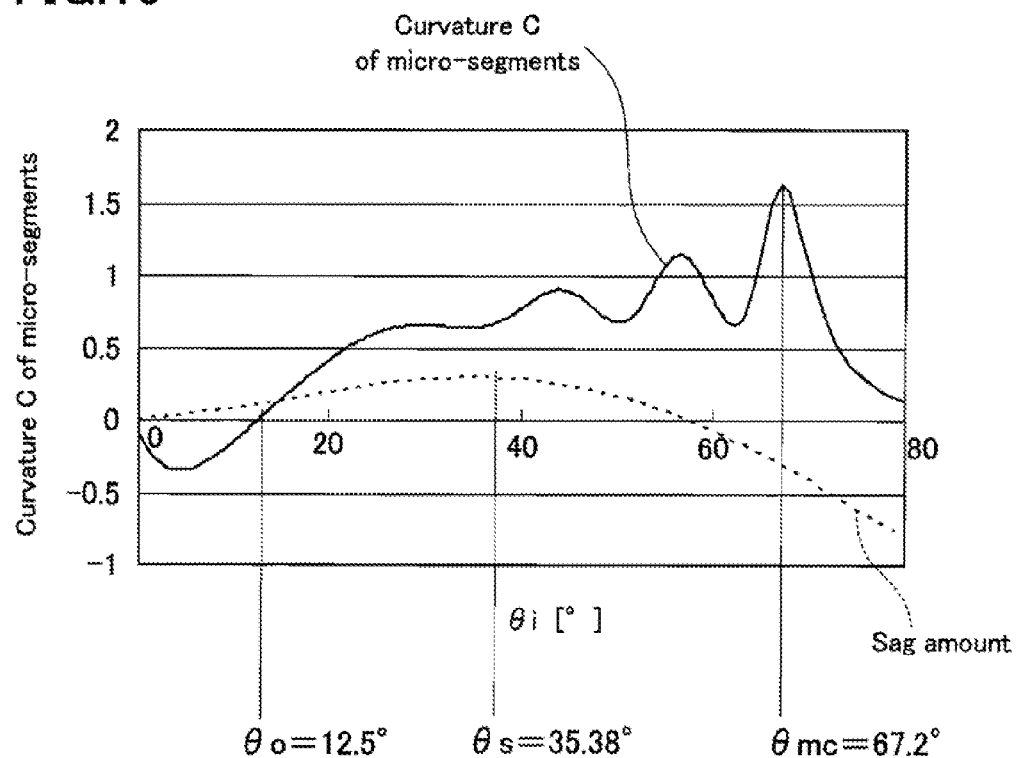
FIG. 19 is a diagram showing a relationship between θi, and a curvature C of micro-segments and a sag amount of the illuminating lens of Example 2.

FIG. 19 shows the curvature C and the sag amount of micro-segments of the illuminating lens of Example 2. The angles θo, θs, and θmc are 12.5 degrees, 35.38 degrees, and 67.2 degrees, respectively.

Figure 20:
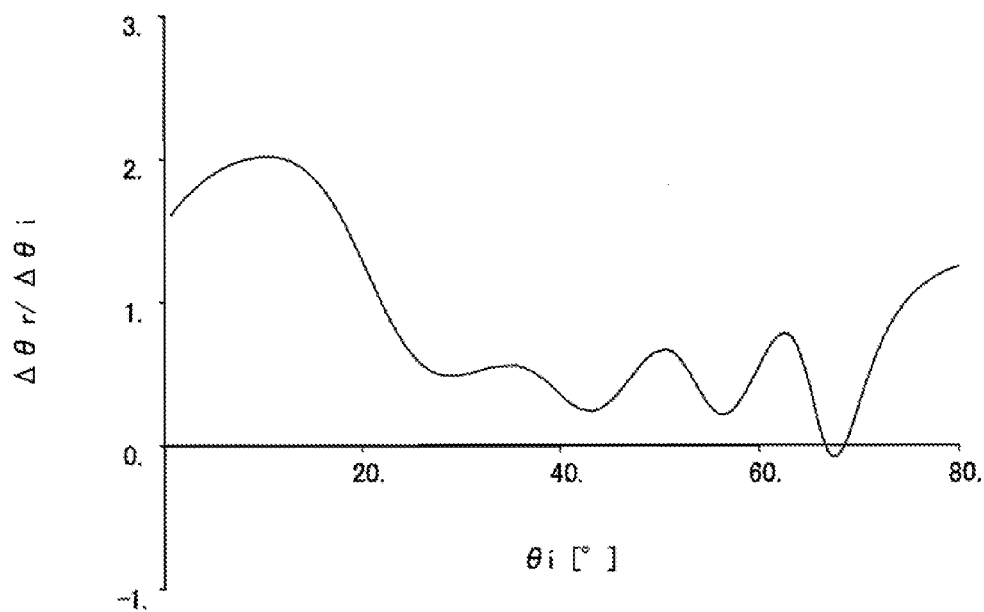
FIG. 20 is a diagram showing a relationship between θi and Δθr/Δθi of the illuminating lens of Example 2.

FIG. 20 shows a change in Δθr/Δθi with an increase in of in the illuminating lens of Example 2. Δθr/Δθi changes in a waveform, and the distance between the waves becomes narrower as θi increases.

Figure 21:
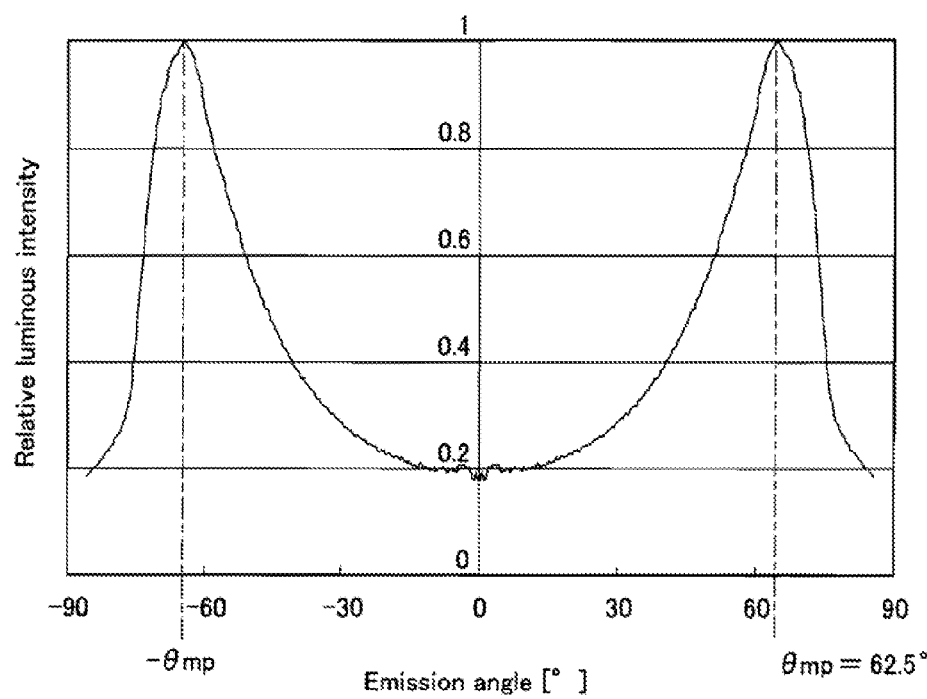
FIG. 21 shows a luminous intensity distribution of light emitted from the light exit surface of the illuminating lens of Example 2.

FIG. 21 shows relative luminous intensities of light rays emitted from the light exit surface of the illuminating lens of Example 2, where the light rays are sorted by respective emission angles. In FIG. 21, θmp is 62.5 degrees. Therefore, θmp/θmc is 0.93.

Example 3

An illuminating lens of Example 3 has a shape corresponding to that shown in FIG. 3. Example 3 is an example of an illuminating lens designed to widen the range of transmission directions for light from a 0.95 mm cubic-shaped light emitting diode as a light source. Table 5 shows the surface data of the illuminating lens of Example 3, and Table 6 shows the aspherical surface data thereof.

TABLE 5

Surface data

| Surface number | r | d | n |
|---|---|---|---|
| Object surface | ∞ | 2.462 | 1.492 |
| 1* | 2.177E−12 | 13.538 | |
| Image surface | ∞ | | |

TABLE 6

Aspherical surface data
First surface

K = −2.8085E+01, A3 = 8.1962E−01, A4 = −1.3756E+00,
A5 = 1.0351E+00
A6 = −4.6852E−01, A7 = 1.5092E−01, A8 = −3.3498E−02,
A9 = 6.6020E−04
A10 = 1.9319E−03, A11 = −1.0865E−04, A12 = −1.2491E−04,
A13 = −1.2357E−06
A14 = 7.9995E−06, A15 = 2.0909E−07, A16 = −3.0106E−07,
A17 = −2.5477E−09
A18 = −6.1609E−10, A19 = 2.0427E−09, A20 = −2.1669E−10

Figure 22:
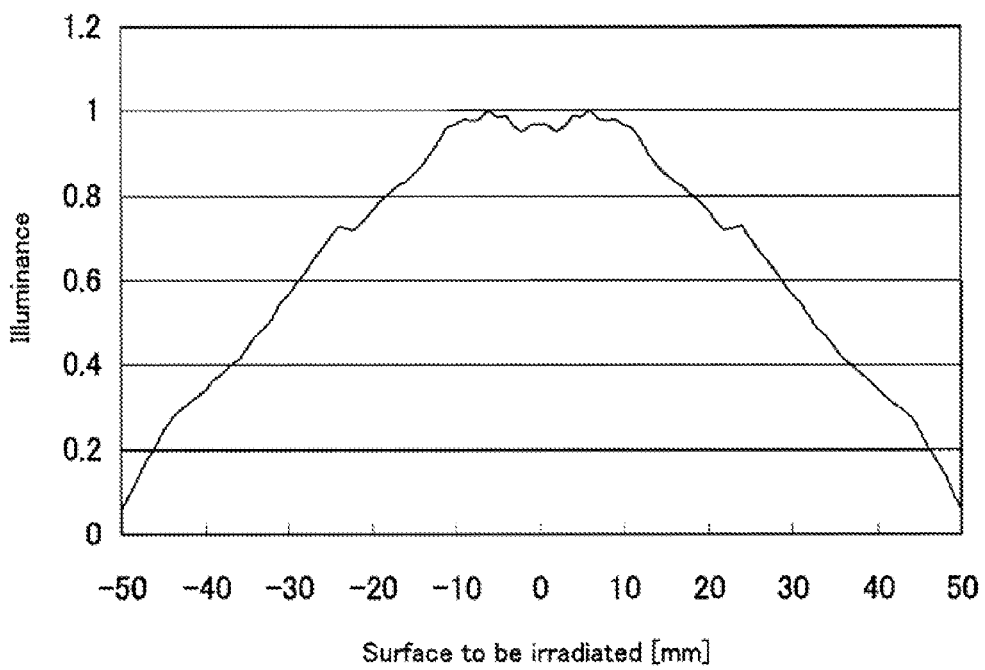
FIG. 22 shows an illuminance distribution obtained by using an illuminating lens of Example 3 in a lighting device.

FIG. 22 shows the illuminance distribution on the surface to be irradiated obtained by calculation assuming that the illuminating lens of Example 3 and the light emitting diode are used and the surface to be irradiated is placed at a distance of 16 mm from the light emitting surface of the light emitting diode.

Figure 23:
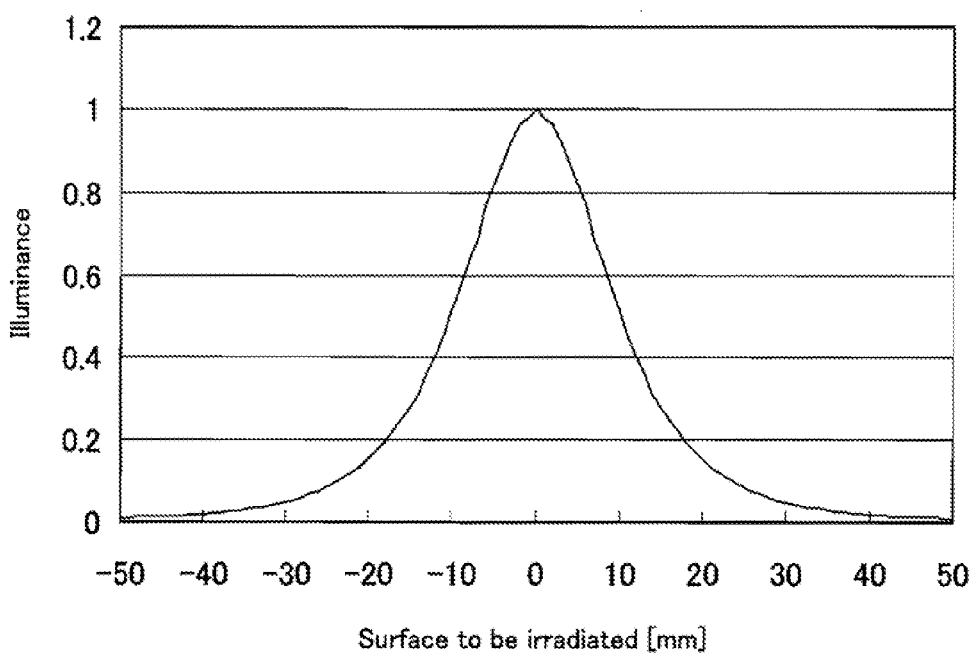
FIG. 23 shows an illuminance distribution obtained by using only light emitting diodes to confirm the effect of the illuminating lens of Example 3.

FIG. 23 shows the illuminance distribution on the surface to be irradiated obtained by calculation assuming that only the same light emitting diode is used and the surface to be irradiated is placed at a distance of 16 mm from the light emitting surface of the light emitting diode.

A comparison between FIG. 22 and FIG. 23 shows that the illuminating lens of Example 3 is effective in increasing the illuminated area of the surface to be irradiated.

Figure 24:
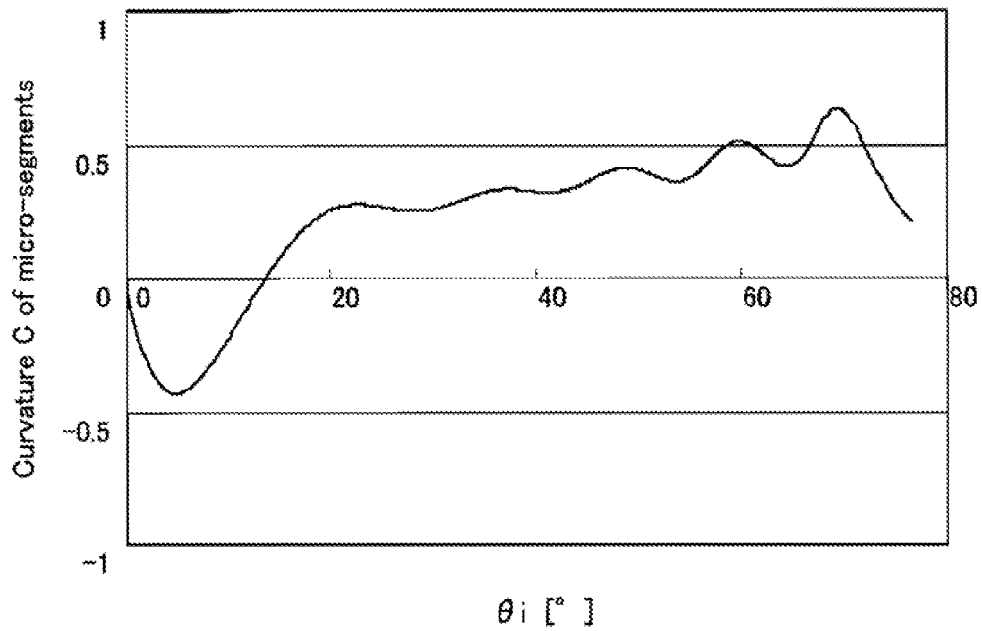
FIG. 24 is a diagram showing a relationship between θi and a curvature C of micro-segments of the illuminating lens of Example 3.

FIG. 24 shows the curvature C of micro-segments of the illuminating lens of Example 3. The horizontal axis represents the angle θi between the optical axis and the line Li connecting the center of each of the micro-segments and the position of the light source on the optical axis. The curvature C reverses its sign at 13.56 degrees, and has a maximum value at 69.52 degrees.

Figure 25:
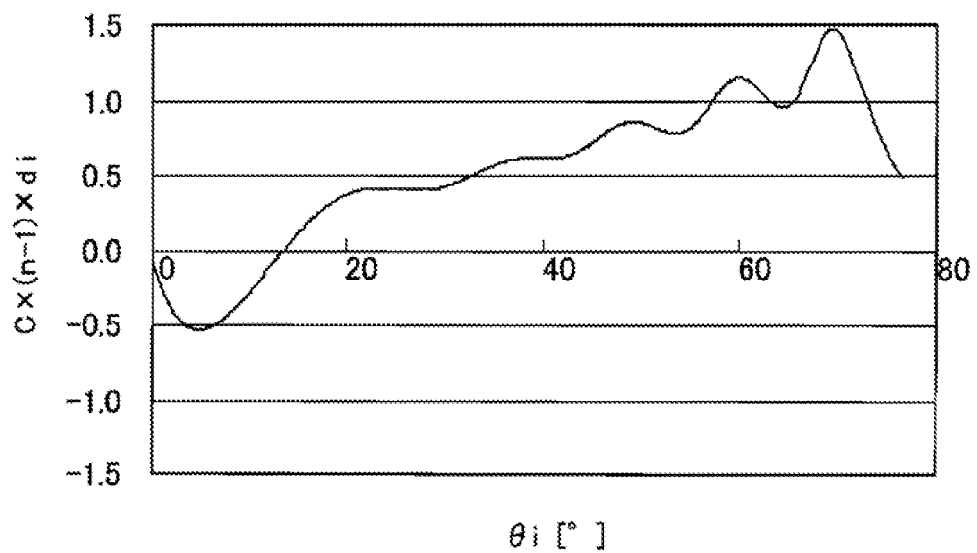
FIG. 25 is a diagram showing a relationship between θi and C×(n−1)×di of the illuminating lens of Example 3.

FIG. 25 shows C×(n−1)×di related to the inequality (4) for the illuminating lens of Example 3. C×(n−1)×di has a maximum value when the angle θi is 69.52 degrees, and the value is 1.47.

Figure 26:
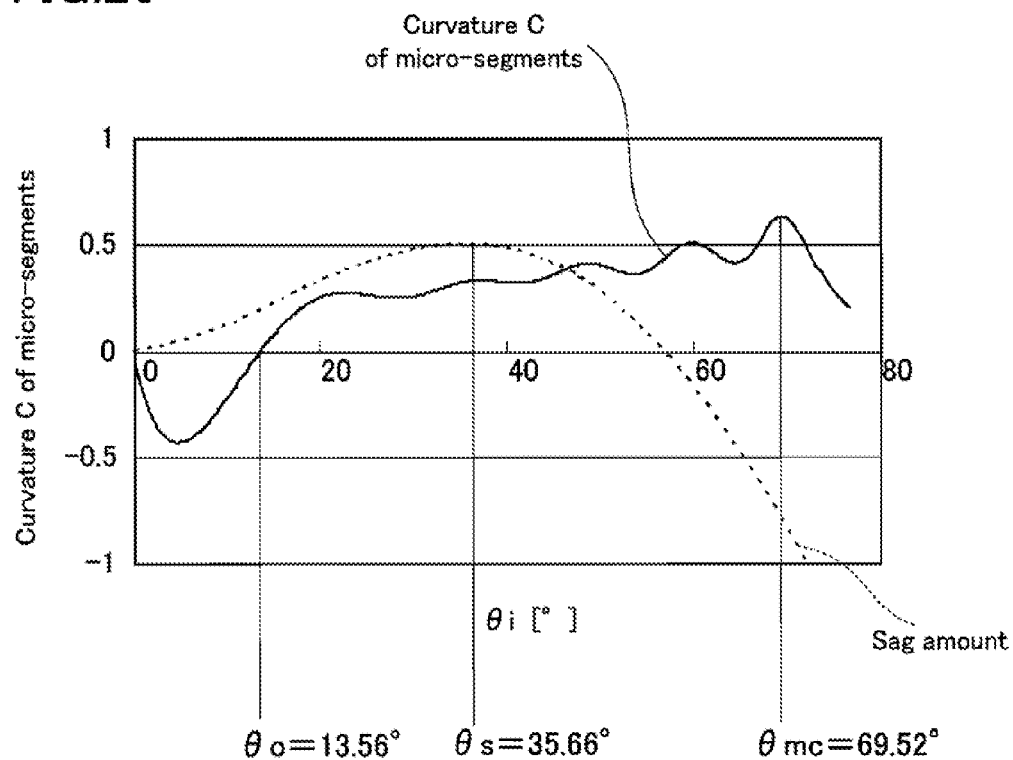
FIG. 26 is a diagram showing a relationship between θi, and a curvature C of micro-segments and a sag amount of the illuminating lens of Example 3.

FIG. 26 shows the curvature C and the sag amount of micro-segments of the illuminating lens of Example 3. The angles θo, θs, and θmc are 13.56 degrees, 35.66 degrees, and 69.52 degrees, respectively.

Figure 27:
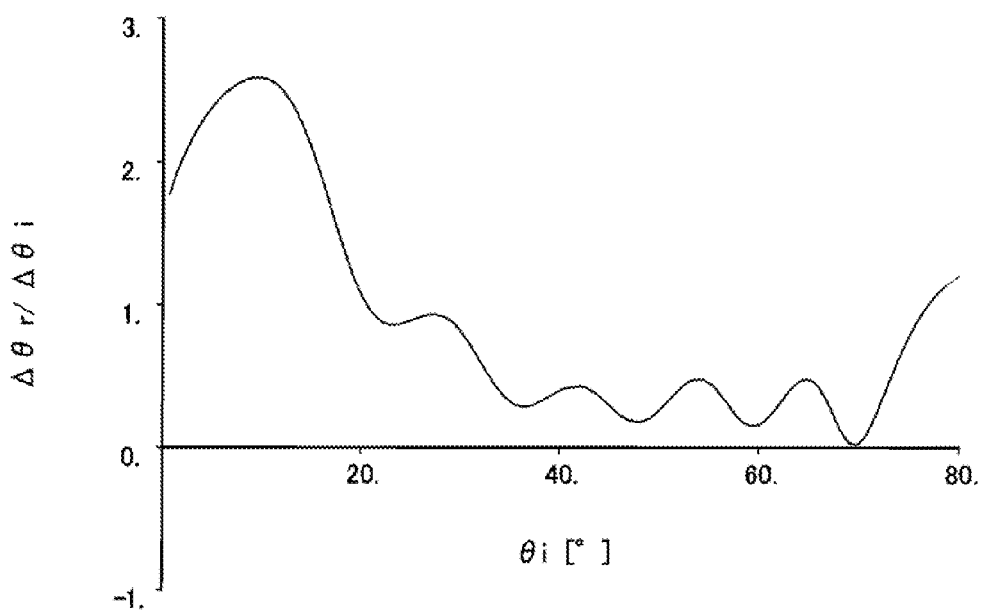
FIG. 27 is a diagram showing a relationship between θi and Δθr/Δθi of the illuminating lens of Example 3.

FIG. 27 shows a change in Δθr/Δθi with an increase in θi in the illuminating lens of Example 3. Δθr/Δθi changes in a waveform, and the distance between the waves becomes narrower as θi increases.

Figure 28:
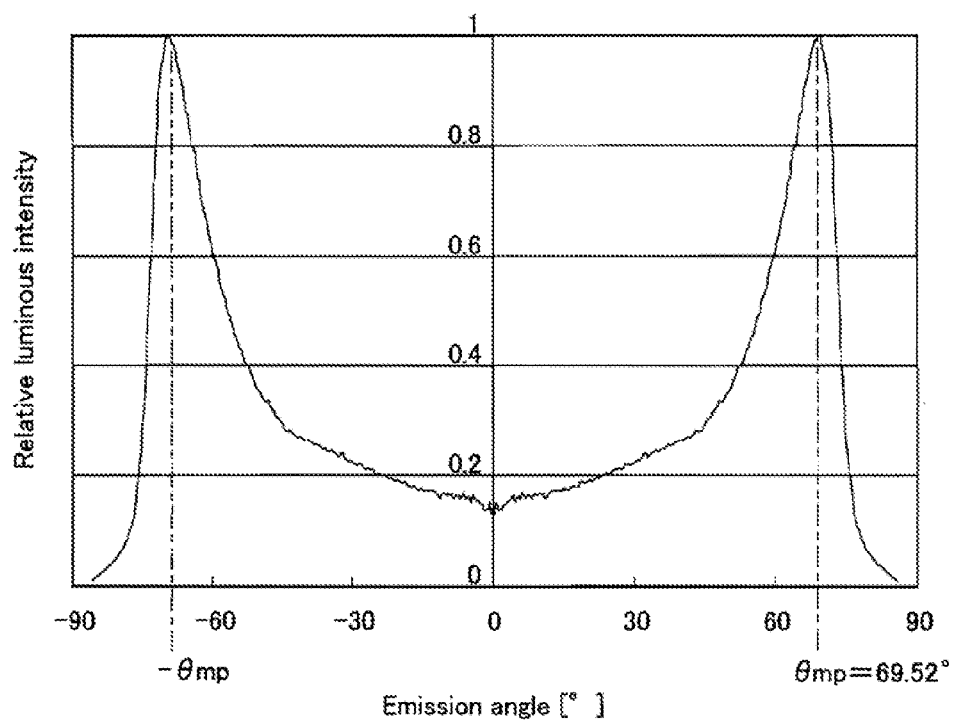
FIG. 28 shows a luminous intensity distribution of light emitted from the light exit surface of the illuminating lens of Example 3.

FIG. 28 shows relative luminous intensities of light rays emitted from the light exit surface of the illuminating lens of Example 3, where the light rays are sorted by respective emission angles. In FIG. 28, θmp is 69.52 degrees. Therefore, θmp/θmc is 1.00.

Table 7 below shows the values corresponding to the conditions defined by the inequalities (1) to (9) for the illuminating lenses of Examples 1 to 3.

TABLE 7

Values corresponding to conditions

| | θi in inequality (1) | Yr in inequality (2) | θmp/θmc in inequality (3) | Cm × (n − 1) × d in inequality (4) | θo in inequality (5) |
|---|---|---|---|---|---|
| Example 1 | 69.8 | 0.93 | 0.97 | 1.51 | 13.77 |
| Example 2 | 67.2 | 0.94 | 0.93 | 1.53 | 12.50 |
| Example 3 | 69.5 | 0.96 | 1.00 | 1.47 | 13.56 |

| | θs in inequality (6) | n in inequality in (7) | D/t in inequality (8) | D/De in inequality (9) |
|---|---|---|---|---|
| Example 1 | 37.06 | 1.410 | 0.519 | 0.11 |
| Example 2 | 35.38 | 1.410 | 0.541 | 0.17 |
| Example 3 | 35.66 | 1.492 | 0.386 | 0.10 |

Third Embodiment

Figure 29:
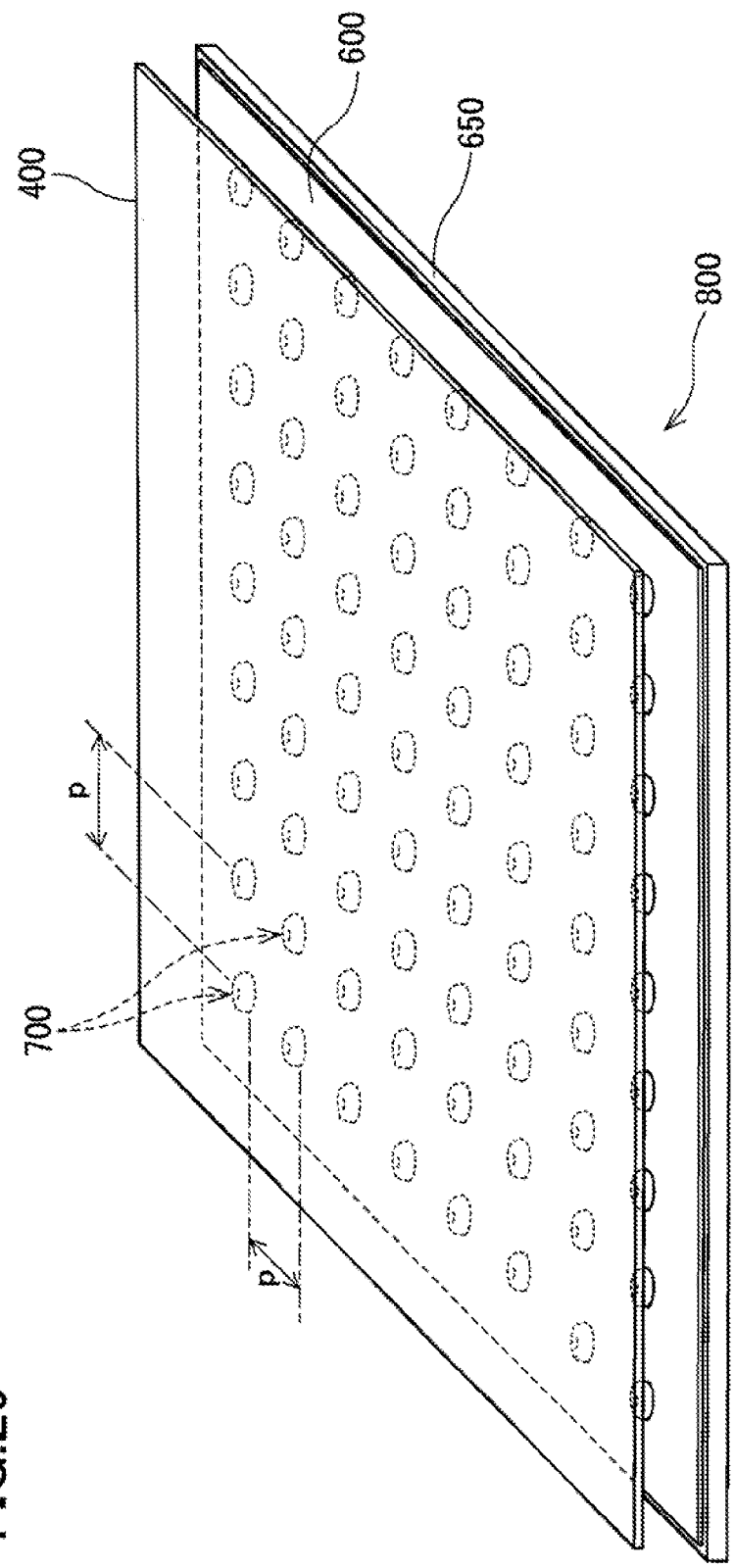
FIG. 29 is a schematic diagram of a surface light source according to a third embodiment of the present invention.
Figure 31:
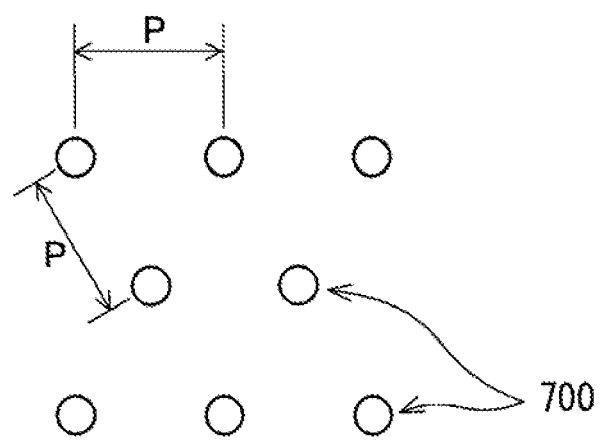
FIG. 31 is a plan view showing another arrangement of lighting devices.

FIG. 29 is a schematic diagram of a surface light source 800 according to a third embodiment of the present invention. This surface light source 800 includes the plurality of lighting devices 700 described in the second embodiment arranged in a plane, and a diffusing plate 400 disposed to cover the plurality of lighting devices 700. The lighting devices 700 may be arranged in a matrix as shown in FIG. 29. They may be arranged in a staggered manner as shown in FIG. 31.

Figure 30:
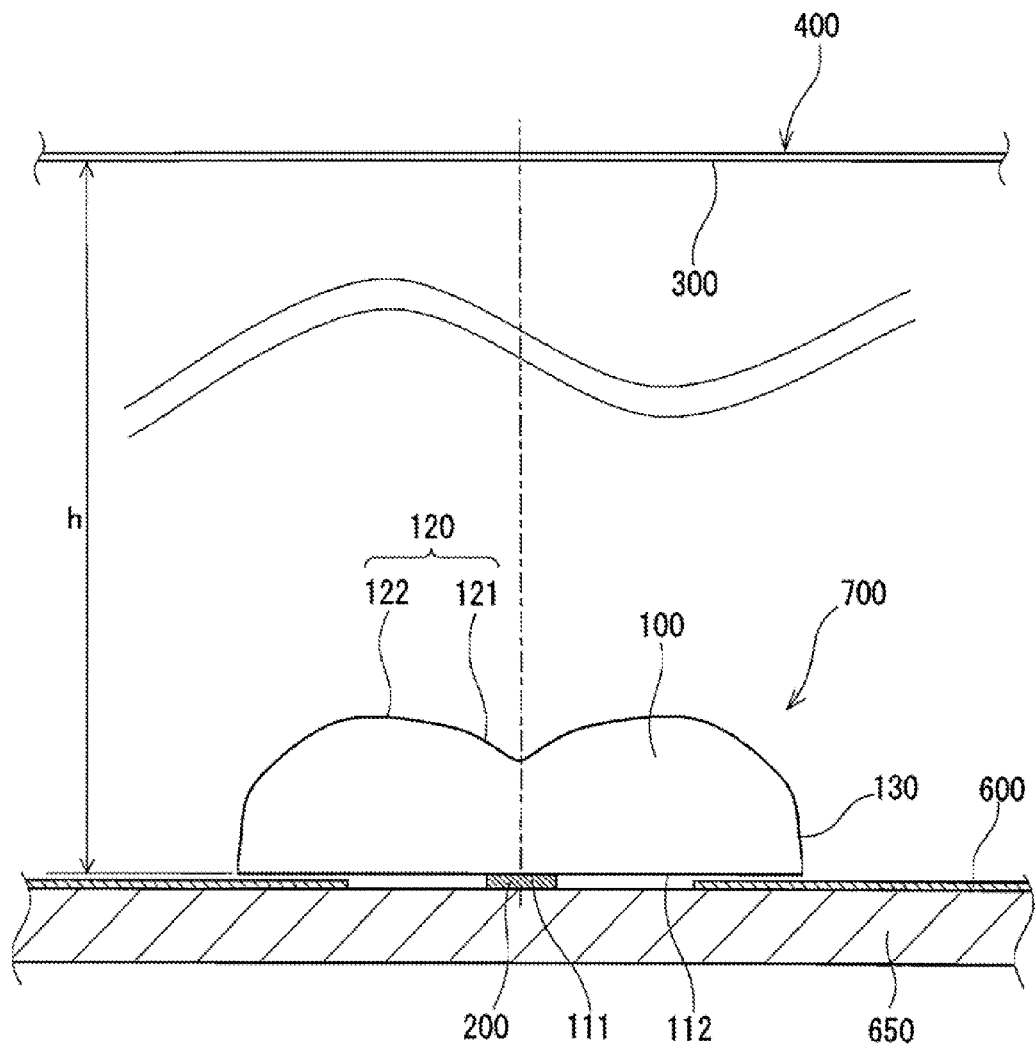
FIG. 30 is a partial cross-sectional view of the surface light source according to the third embodiment of the present invention.

The surface light source 800 includes a substrate 650 facing the diffusing plate 400 with the lighting devices 7 being disposed therebetween. As shown in FIG. 30, the light emitting diode 200 of each lighting device 700 is mounted on the substrate 650. In the present embodiment, a reflecting plate 600 is disposed on the substrate 650 to cover the substrate 650 with the light emitting diodes 200 being exposed. In the present embodiment, the light entrance surface 111 of the illuminating lens 100 and the bottom surface 112 surrounding the light entrance surface 111 are on the same level.

The lighting device 700 emits light to one surface (light entrance surface) of the diffusing plate 400. That is, the one surface of the diffusing plate 400 is the surface to be irradiated 300 that has been described in the first and second embodiments. The diffusing plate 400 emits the light received on its one surface from the other surface (light exit surface) in a diffused manner. The lighting devices 700 emit light individually toward a large area of the one surface of the diffusing plate 400 so that the one surface has a uniform illuminance, and upon receiving this light, the diffusing plate 400 emits the light diffusely. As a result, the surface light source capable of emitting light having less uneven brightness in the plane is obtained.

The light emitted from the lighting device 700 is diffused by the diffusing plate 400 so that the diffuse light returns to the lighting device side or passes through the diffusing plate 400. The light that has returned to the lighting device side and struck the reflecting plate 600 is reflected at the reflecting plate 600 and again enters the diffusing plate 400.

It is preferable that the surface light source 800 satisfies the following inequality (10):

$$0.2 < h/p < 0.4 \tag{10}$$

(more preferably, $0.25 < h/p < 0.35$) (10)' where h is the distance from the light emitting surface of the light emitting diode 200 in each of the lighting devices 700 to the light entrance surface of the diffusing plate 400, and p is the arrangement pitch of the lighting devices 700.

The inequality (10) (or the inequality (10)') defines the distance between the light emitting surface of each of the lighting devices 700 and the diffusing plate 400 with respect to the arrangement pitch of the lighting devices 700. As stated herein, the "arrangement pitch" means the distance between the optical axes of the adjacent lighting devices 700 in the direction in which the lighting devices 700 are aligned. There are two orthogonal directions of alignment of the lighting devices 700, that is, lateral and longitudinal directions thereof in the case where they are arranged in a matrix as shown in FIG. 29. There are two directions, that is, lateral and oblique directions in the case where they are arranged in a staggered manner as shown in FIG. 31. The pitch in one direction need not necessarily coincide with that in the other direction, but preferably, the pitches in these two directions coincide with each other.

If the value of h/p exceeds the upper limit of the inequality (10) (or the inequality (10)'), the diffusing plate 400 is too far from the lighting devices 700 with respect to the arrangement pitch of the lighting devices 700, which increases the surface light source in size. If the value of h/p is less than the lower limit, it is difficult to maintain the uniformity in the brightness distribution on the diffusing plate 400, which increases the unevenness of in-plane brightness.

Furthermore, it is preferable that the surface light source 800 satisfies the following inequality (11):

$$0.04 < D/h < 0.15 \tag{11}$$

(more preferably, $0.05 < D/h < 0.13$) (11)' where D is the maximum width of the light emitting surface of the light emitting diode 200, and h is the distance from the light emitting surface of the light emitting diode 200 in each of the lighting devices 700 to the light entrance surface of the diffusing plate 400.

The inequality (11) (or the inequality (11)') defines the size of the light emitting diode 200 with respect to the distance between the light emitting surface of each of the lighting devices 700 and the diffusing plate 400. If the value of D/h exceeds the upper limit of the inequality (11) (or the inequality (11)'), the size of the light emitting diode 200 is excessively large with respect to the distance between the light emitting surface of each of the lighting devices 700 and the diffusing plate 400. As a result, it is difficult to ensure the lens power required to widen the range of light distribution by using the illuminating lens 100. If the value of D/h is less than the lower limit, the distance between the light emitting surface of each of the lighting devices 700 and the diffusing plate 400 is excessively large with respect to the size of the light emitting diode 200, which increases the surface light source in size.

Table 8 below shows the values corresponding to the conditions defined by the inequalities (10) and (11), which are obtained by using Examples 1 to 3 shown in the second embodiment.

TABLE 8

| | Values corresponding to conditions | |
|---|---|---|
| | h/p in inequality (10) | D/h in inequality (11) |
| Example 1 | 0.29 | 0.063 |
| Example 2 | 0.29 | 0.081 |
| Example 3 | 0.29 | 0.059 |

Fourth Embodiment

Figure 32:
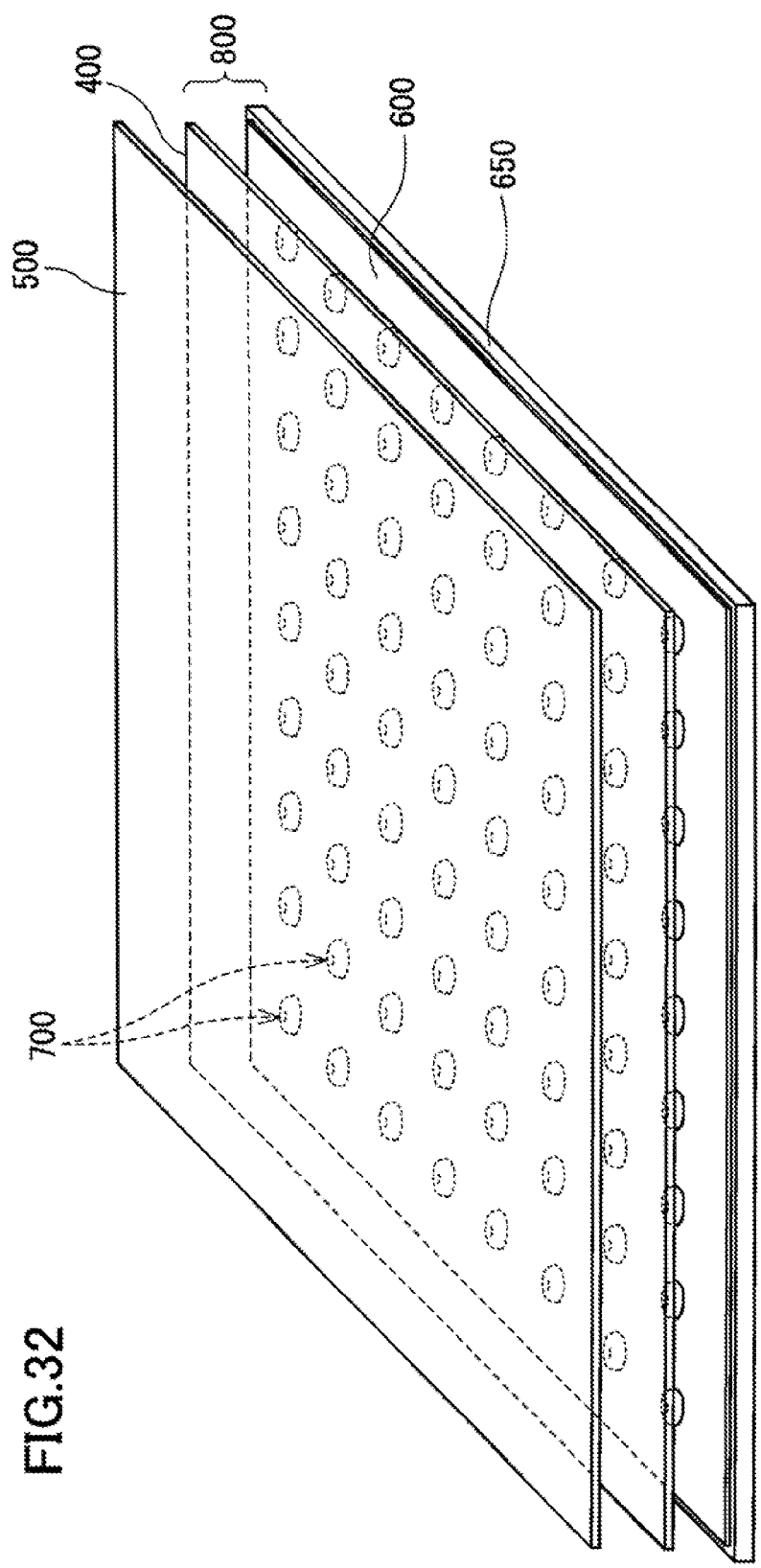
FIG. 32 is a schematic diagram of a liquid-crystal display apparatus according to a fourth embodiment of the present invention.

FIG. 32 is a schematic diagram of a liquid-crystal display apparatus according to a fourth embodiment of the present invention. This liquid-crystal display apparatus includes a liquid-crystal panel 500, and a surface light source 800 described in the third embodiment disposed behind the liquid-crystal panel 500.

A plurality of lighting devices 700 each including the light emitting diode 200 and the illuminating lens 100 are arranged in a plane, and the diffusing plate 400 is illuminated by these lighting devices 700. The underside (one surface) of the diffusing plate 400 is irradiated with the light emitted from the lighting devices 700 to have a uniform illuminance, and then the light is diffused by the diffusing plate 400. Thus, the liquid-crystal panel 500 is illuminated by the diffused light.

It is preferable that an optical sheet such as a diffusing sheet or a prism sheet is disposed between the liquid-crystal panel 500 and the surface light source 800. In this case, the light that has passed through the diffusing plate 400 further is diffused by the optical sheet and illuminates the liquid-crystal panel 500.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A lighting device, comprising:
a light emitting diode for emitting light; and
a illuminating lens for spreading light emitted from the light emitting diode so that a surface to be irradiated is irradiated with the spread light, and
wherein the light emitting diode and the illuminating lens satisfy the following inequality (8):

$$0.3 < D/t < 0.9 \tag{8}$$

where D is a maximum width of a light emitting surface of the light emitting diode, and t is a center thickness of the illuminating lens,
the illuminating lens including:
a light entrance surface through which the light emitted from the light emitting diode enters the illuminating lens; and
a light exit surface through which the light that has entered the illuminating lens exits the illuminating lens, the light exit surface being rotationally symmetric with respect to an optical axis,
wherein the light exit surface has a concave portion and a convex portion, the concave portion intersecting the optical axis, and the convex portion being provided around the concave portion to extend continuously from the concave portion,
the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion,
a position of a micro-segment with the maximum curvature Cm is within a range defined by the following inequality (1):

$$60° < \theta i < 80° \tag{1}$$

where θi is an angle between the optical axis and a line connecting a position of the light emitting diode on the optical axis and a center of each of the micro-segments, and
the midpoint of the convex portion being defined by a point that bisects a curve between one end of the convex portion and other end of the convex portion in the cross section.

2. The lighting device according to claim 1, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

3. A lighting device comprising:
a light emitting diode for emitting light; and
an illuminating lens for spreading light emitted from the light emitting diode so that a surface to be irradiated is irradiated with the spread light,
wherein the light emitting diode and the illuminating lens satisfy the following inequality (8):

$$0.3 < D/t < 0.9 \tag{8}$$

where D is a maximum width of a light emitting surface of the light emitting diode, and t is a center thickness of the illuminating lens,
the illuminating lens including:
a light entrance surface through which the light emitted from the light emitting diode enters the illuminating lens; and
a light exit surface through which the light that has entered the illuminating lens exits the illuminating lens, the light exit surface being rotationally symmetric with respect to an optical axis,
wherein the light exit surface has a concave portion and a convex portion, the concave portion intersecting the optical axis, and the convex portion being provided around the concave portion to extend continuously from the concave portion,
the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion,
a position of a micro-segment with the maximum curvature Cm is within a range defined by the following inequality (2):

$$0.88 < Yr < 0.98 \tag{2}$$

where Yr is a ratio of a distance from the optical axis to a center of each of the micro-segments with respect to half an effective diameter of the illuminating lens, and
the midpoint of the convex portion being defined by a point that bisects a curve between one end of the convex portion and other end of the convex portion in the cross section.

4. The lighting device according to claim 3, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

5. A lighting device comprising:
a light emitting diode for emitting light; and
an illuminating lens for spreading light emitted from the light emitting diode so that a surface to be irradiated is irradiated with the spread light,
wherein the light emitting diode and the illuminating lens satisfy the following inequality (8):

$$0.3 < D/t < 0.9 \tag{8}$$

where D is a maximum width of a light emitting surface of the light emitting diode, and t is a center thickness of the illuminating lens,
the illuminating lens including:
a light entrance surface through which the light emitted from the light emitting diode enters the illuminating lens; and
a light exit surface through which the light that has entered the illuminating lens exits the illuminating lens, the light exit surface being rotationally symmetric with respect to an optical axis,
wherein the light exit surface has a concave portion and a convex portion, the concave portion intersecting the optical axis, and the convex portion being provided around the concave portion to extend continuously from the concave portion, the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion, the light exit surface satisfies the following inequality (3):

$$0.90 < \theta mp/\theta mc < 1.05 \quad (3)$$

where θmc is an angle between the optical axis and a line connecting a position of the light emitting diode on the optical axis and a center of a micro-segment with the maximum curvature Cm, and θmp is, among emission angles that are angles between light rays emitted from the light exit surface and the optical axis, an emission angle having a maximum luminous intensity, where the light rays are sorted by respective emission angles, and the midpoint of the convex portion being defined by a point that bisects a curve between one end of the convex portion and other end of the convex portion in the cross section.

6. The lighting device according to claim 5, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

7. A lighting device, comprising:

a light emitting diode for emitting light; and an illuminating lens for spreading light emitted from the light emitting diode so that a surface to be irradiated is irradiated with the spread light, wherein the light emitting diode and the illuminating lens satisfy the following inequality (9):

$$0.06 < D/De < 0.27 \quad (9)$$

where D is a maximum width of a light emitting surface of the light emitting diode, and De is an effective diameter of the illuminating lens, the illuminating lens including:

a light entrance surface through which the light emitted from the light emitting diode enters the lens; and a light exit surface through which the light that has entered the lens exits the lens, the light exit surface being rotationally symmetric with respect to an optical axis, wherein the light exit surface has a concave portion and a convex portion, the concave portion intersecting the optical axis, and the convex portion being provided around the concave portion to extend continuously from the concave portion, the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion, a position of a micro-segment with the maximum curvature Cm is within a range defined by the following inequality (1):

$$60° < \theta i < 80° \quad (1)$$

where θi is an angle between the optical axis and a line connecting a position of the light emitting diode on the optical axis and a center of each of the micro-segments, and the midpoint of the convex portion being defined by a point that bisects a curve between one end of the convex portion and other end of the convex portion in the cross section.

8. The lighting device according to claim 7, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

9. A lighting device, comprising:

a light emitting diode for emitting light; and an illuminating lens for spreading light emitted from the light emitting diode so that a surface to be irradiated is irradiated with the spread light, wherein the light emitting diode and the illuminating lens satisfy the following inequality (9):

$$0.06 < D/De < 0.27 \quad (9)$$

where D is a maximum width of a light emitting surface of the light emitting diode, and De is an effective diameter of the illuminating lens, the illuminating lens including:

a light entrance surface through which the light emitted from the light emitting diode enters the illuminating lens; and a light exit surface through which the light that has entered the illuminating lens exits the illuminating lens, the light exit surface being rotationally symmetric with respect to an optical axis, wherein the light exit surface has a concave portion and a convex portion, the concave portion intersecting the optical axis, and the convex portion being provided around the concave portion to extend continuously from the concave portion, the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion, a position of a micro-segment with the maximum curvature Cm is within a range defined by the following inequality (2):

$$0.88 < Yr < 0.98 \quad (2)$$

where Yr is a ratio of a distance from the optical axis to a center of each of the micro-segments with respect to half an effective diameter of the illuminating lens, and the midpoint of the convex portion being defined by a point that bisects a curve between one end of the convex portion and other end of the convex portion in the cross section.

10. The lighting device according to claim 9, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

11. A lighting device, comprising:
a light emitting diode for emitting light; and
an illuminating lens for spreading light emitted from the light emitting diode so that a surface to be irradiated is irradiated with the spread light,
wherein the light emitting diode and the illuminating lens satisfy the following inequality (9):

$$0.06 < D/De < 0.27 \qquad (9)$$

where D is a maximum width of a light emitting surface of the light emitting diode, and De is an effective diameter of the illuminating lens,
the illuminating lens including:
a light entrance surface through which the light emitted from the light emitting diode enters the illuminating lens; and
a light exit surface through which the light that has entered the illuminating lens exits the illuminating lens, the light exit surface being rotationally symmetric with respect to an optical axis,
wherein the light exit surface has a concave portion and a convex portion, the concave portion intersecting the optical axis, and the convex portion being provided around the concave portion to extend continuously from the concave portion,
the light exit surface is formed in a shape such that when the light exit surface is divided into micro-segments in a cross section that includes the optical axis, wherein the micro-segments have respective curvatures C, a maximum curvature Cm among curvatures C is positioned outward from a midpoint of the convex portion,
the light exit surface satisfies the following inequality (3):

$$0.90 < \theta mp/\theta mc < 1.05 \qquad (3)$$

where θmc is an angle between the optical axis and a line connecting a position of the light emitting diode on the optical axis and a center of a micro-segment with the maximum curvature Cm, and θmp is, among emission angles that are angles between light rays emitted from the light exit surface and the optical axis, an emission angle having a maximum luminous intensity, where the light rays are sorted by respective emission angles, and
the midpoint of the convex portion being defined by a point that bisects a curve between one end of the convex portion and other end of the convex portion in the cross section.

12. The lighting device according to claim 11, wherein in the case where a light ray emitted from a position of the light emitting diode on the optical axis at an angle of θi with respect to the optical axis is refracted at the light exit surface at an angle of θr with respect to the optical axis, a variation in the angle θr with respect to an increment in the angle θi with an increase in the angle θi increases and decreases repeatedly in the convex portion.

* * * * *